US008336006B2

(12) United States Patent
Kodera et al.

(10) Patent No.: US 8,336,006 B2
(45) Date of Patent: Dec. 18, 2012

(54) MASK-LAYOUT CREATING METHOD, APPARATUS THEREFOR, AND COMPUTER PROGRAM PRODUCT

(75) Inventors: Katsuyoshi Kodera, Kanagawa (JP); Chikaaki Kodama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 13/028,525

(22) Filed: Feb. 16, 2011

(65) Prior Publication Data

US 2011/0209107 A1 Aug. 25, 2011

(30) Foreign Application Priority Data

Feb. 24, 2010 (JP) ................................ 2010-039402

(51) Int. Cl.
*G06F 17/50* (2006.01)
*G03H 3/00* (2006.01)
(52) U.S. Cl. ................ 716/55; 716/50; 716/51; 716/52; 716/53; 716/54; 716/132
(58) Field of Classification Search .............. 716/51–55, 716/132; 430/5
See application file for complete search history.

(56) References Cited

U.S. PATENT DOCUMENTS

| | | | | |
|---|---|---|---|---|
| 6,658,640 B2 * | 12/2003 | Weed | .............................. | 716/52 |
| 7,506,299 B2 * | 3/2009 | Socha et al. | ................... | 716/132 |
| 7,552,416 B2 * | 6/2009 | Granik et al. | ................... | 716/50 |
| 7,657,865 B2 * | 2/2010 | Yamazoe | ........................ | 716/54 |
| 7,761,840 B2 * | 7/2010 | Yamazoe | ........................ | 716/54 |
| 7,882,480 B2 * | 2/2011 | Ye et al. | .......................... | 716/53 |
| 7,987,434 B2 * | 7/2011 | Granik et al. | ................... | 716/50 |
| 8,059,262 B2 * | 11/2011 | Yamazoe | ........................ | 355/77 |
| 2004/0229133 A1 | 11/2004 | Socha et al. | | |
| 2005/0142470 A1 | 6/2005 | Socha et al. | | |
| 2007/0105029 A1 * | 5/2007 | Ausschnitt | ..................... | 430/30 |
| 2008/0052334 A1 | 2/2008 | Yamazoe | | |

(Continued)

FOREIGN PATENT DOCUMENTS

JP 2006-065338 3/2006

(Continued)

OTHER PUBLICATIONS

Pezeshki et al.; "Kernel-based canonical coordinate decomposition of two-channel nonlinear maps"; Publication Year: 2004; Neural Networks, Proceedings. 2004 IEEE International Joint Conference on; vol. 4; pp. 3019-3024 vol. 4.*

(Continued)

*Primary Examiner* — Helen Rossoshek
(74) *Attorney, Agent, or Firm* — Finnegan, Henderson, Farabow, Garrett & Dunner, L.L.P.

(57) ABSTRACT

According to one embodiment, a design layout highly likely to be a dangerous point in a lithography process is set, a coherence map kernel for generating the mask layout is set with respect to the set design layout, the coherence map is created based on the set coherence map kernel and the set design layout, the auxiliary pattern is extracted from the created coherence map and shaped to generate the mask layout, a cost function COST for evaluating an optimization degree of the mask layout is defined, the generated mask layout is evaluated using the cost function, and at least one of parameters of the coherence map kernel and parameters in extracting and shaping the auxiliary pattern from the coherence map are changed until the mask layout evaluated using the cost function is optimized.

8 Claims, 16 Drawing Sheets

U.S. PATENT DOCUMENTS

| | | | | |
|---|---|---|---|---|
| 2008/0301620 A1* | 12/2008 | Ye et al. | ............ | 716/19 |
| 2010/0251202 A1* | 9/2010 | Pierrat | ............ | 716/20 |
| 2011/0029937 A1* | 2/2011 | Kodera et al. | ............ | 716/52 |
| 2011/0294239 A1* | 12/2011 | Kodama et al. | ............ | 438/16 |
| 2012/0019805 A1* | 1/2012 | Yamazoe | ............ | 355/77 |

FOREIGN PATENT DOCUMENTS

| | | |
|---|---|---|
| JP | 3992688 | 8/2007 |
| JP | 2008-040470 | 2/2008 |
| JP | 2008-076682 | 4/2008 |
| JP | 2009-031320 | 2/2009 |
| JP | 2009-251518 | 10/2009 |

OTHER PUBLICATIONS

Kodera et al.; "Novel Fine-Tuned Model-Based SRAF Generation Method Using Coherence Map", Proc. of SPIE, vol. 7640, pp. 764017-1-764017-9, (2010).

Socha et al.; "Contact Hole Reticle Optimization by Using Interference Mapping Lithography (IML™)", Proc. of SPIE, vol. 5377, pp. 222-240, (2004).

Hopkins; "On the Diffraction Theory of Optical Images", Proc. R. Soc. London, Ser. A, No. 217, pp. 408-432, (1953).

Born et al."Principles of Optics", $6^{th}$ Edition, (Cambridge University Press, 1980, pp. 530-533, (1980).

Gamo; "Matrix Treatment of Partial Coherence", Progress in Optics, vol. 3, ed., Emil Wolf (North-Holland, 1964), pp. 189-332, (1964).

Pati et al.; "Phase-Shifting Masks for Microlithography: Automated Design and Mask Requirements", J. Opt. Soc. Am. A, vol. 11, No. 9, pp. 2438-2452, (1994).

Cobb et al.; "Mathematical and CAD Framework for Proximity Correction", SPIE, vol. 2726, Optical Microlithography IX, ed. Gene E. Fuller, (SPIE, 1996), pp. 208-222, (1996).

Rosenbluth et al.; "Fast Calculation of Images for High Numerical Aperture Lithography", Proc. of SPIE, vol. 5377, pp. 615-628, (2004).

* cited by examiner

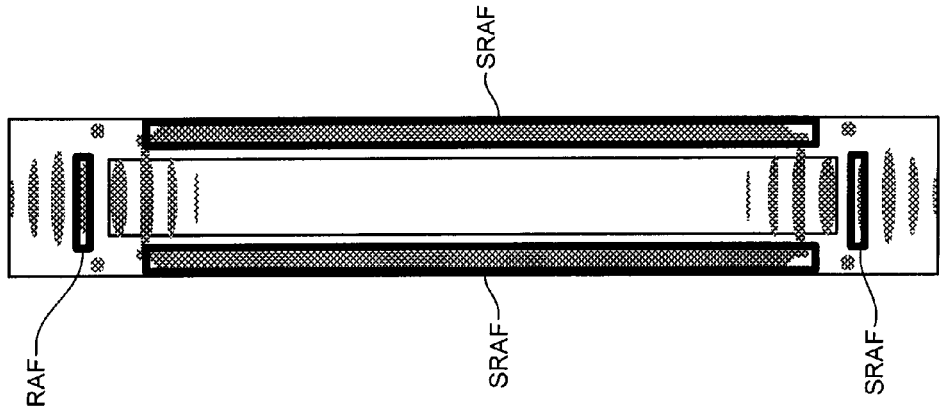
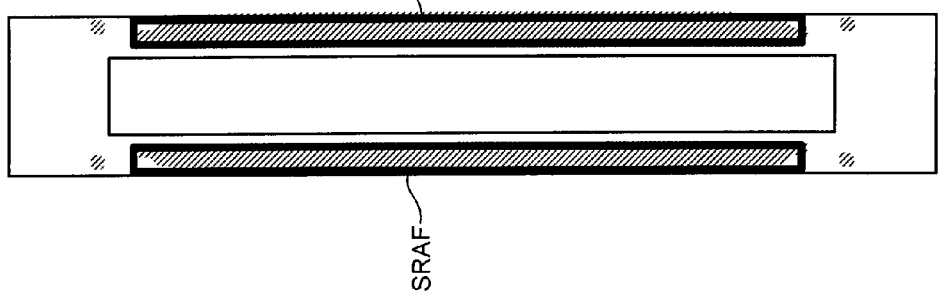
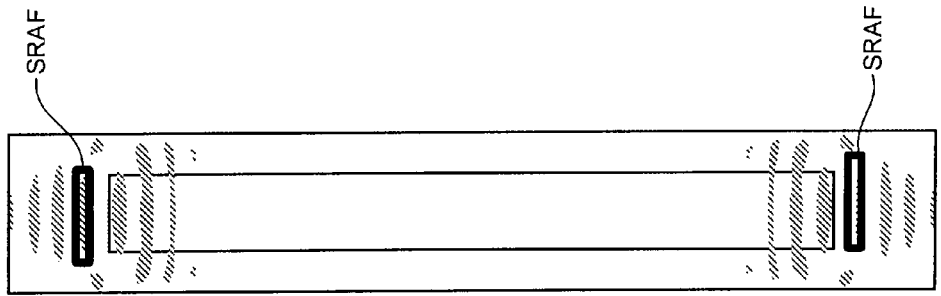
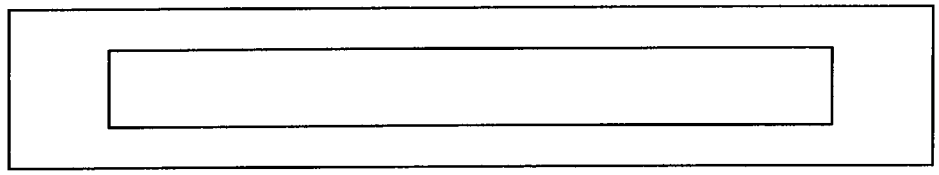

ISOLATED HOLE

↓

FOCUS MARGIN
IMPORTANT

DENSE PITCH HOLE

↓

EL MARGIN
IMPORTANT $FT^{-1}(\phi_0)$ $FT^{-1}(\phi_k)$

MASK-LAYOUT CREATING METHOD, APPARATUS THEREFOR, AND COMPUTER PROGRAM PRODUCT

CROSS-REFERENCE TO RELATED APPLICATIONS

This application is based upon and claims the benefit of priority from Japanese Patent Application No. 2010-039402, filed on Feb. 24, 2010; the entire contents of which are incorporated herein by reference.

FIELD

Embodiments described herein relate generally to a mask-layout creating method, a mask-layout creating apparatus, and a computer program product.

BACKGROUND

In recent years, according to microminiaturization of patterns for forming semiconductor devices, it is becoming difficult to secure a sufficient margin only by finely adjusting main patterns. Therefore, at present, layout design is performed by using auxiliary patterns (Sub-Resolution Assist Features (SRAFs)) for improving a lithography margin. The SRAFs need to be arranged such that a plurality of process margins can be sufficiently secured. For example, the SRAFs need to be arranged such that process margins such as an exposure amount margin (EL), a depth of focus (DoF: a focus margin), a margin with respect to σ sensitivity of a light source, and a mask enhancement factor (MEF: a mask error sensitivity factor).

As such a method of arranging the SRAFs, there are two kinds of arrangement methods: a rule-base SRAF arranging method and a model-base SRAF arranging method. The rule-base SRAF arranging method is a method in which a lithography designer manually creates, based on budgets of required various process margins, optimum SRAF arrangement rules for each design layout. An optimization degree for the SRAFs is high when the rule-base SRAF arranging method is used. However, there are two disadvantages that long turn around time (TAT) is required for the rule creation and optimization of the SRAFs with respect to a random layout is difficult.

On the other hand, the mode-base SRAF arranging method is a method of carrying out an approximation operation allowable for an exposure device optical system in terms of accuracy to calculate, only from an approximated optical model, optimum SRAF arrangement for improving a certain independent process margin. As the optical mode, a plurality of physical models such as an SRAF arrangement calculation model for maximizing the EL and an SRAF arrangement calculation mode for maximizing the DoF are conceivable. In the model-base SRAF arranging method, there is an advantage that, unlike the rule-base SRAF arranging method, the TAT of SRAF arrangement rule creation is not long and optimum SRAF arrangement can be calculated even with respect to a layout having high randomness.

Outlines of two ideas of the model-base SRAF arranging method are explained below. A first idea is a method of an SRAF arranging technology employing sequential correction. A lithography simulation is performed based on a mask layout in which the SRAFs are arranged. A wafer result w of the mask layout is simulated. The quality of the wafer result w is determined according to process margins of the wafer result w (process window qualification). The SRAF arrangement of the mask layout is sequentially corrected to improve the process margins. In this method, there is an advantage that highly-accurately tuned SRAF arrangement can be performed. However, there is, on the other hand, a disadvantage that a calculation amount proportional to the number of times of simulation loop is necessary for the SRAF arrangement and the TAT is extremely long.

A second idea is a method of calculating SRAF arrangement according to a coherence map method. Concerning the coherence map method, for example, United States Patent Application Publication No. 2008/0301620, Japanese Patent No. 3992688, Japanese Patent Application Laid-Open No. 2008-40470, Japanese Patent Application Laid-Open No. 2008-76682, United States Patent Application Publication No. 2004/0229133A1, United States Patent Application Publication No. 2005/0142470A1, United States Patent Application Publication No. 2008/0052334A1, and "R. Socha et al., Proc. SPIE 5377 (2004), pp. 222-pp. 240" are publicly known. In the coherence map method, first, a coherence map is calculated as indicated by the following Formula (1) according to a linear formula of a function w calculated from a circuit pattern, which should be set as a target, and a coherence map kernel Φ:

$$\Psi = w \otimes \Phi \qquad (1)$$

where, "$\otimes$" indicates convolutional integration operation.

Subsequently, SRAFs "m" from which SRAFs considered optimum can be manufactured as a mask are extracted based on the calculated coherence map Ψ. As an extraction method, SRAFs that are present in an area including a mask area defined by the following Formula (2) and include mask constraints (e.g., constraints for a mask layout for making it easy to set, in manufacturing, the size and the position in a rectilinear polygon including vertical and horizontal segments) are extracted:

$$M = \{(x,y) | \Psi(x,y) > \text{Threshold}\} \qquad (2)$$

where, "Threshold" is an optimum positive number.

An advantage of the coherence map method is the shortness of the TAT. However, because of the principle of the coherence map method that the approximation calculation is performed, there is a problem in SRAF arrangement accuracy. Specifically, first, in the present coherence map mode, a coherence map kernel Ψ subjected to approximation calculation taking into account only improvement of one process margin is used. SRAFs having high robustness against the other process margins not taken into account cannot be generated. As an example, in a model using the coherence map kernel Φ subjected to the approximation calculation taking into account only improvement of the exposure amount margin, SRAFs having high robustness against the process margins other than the exposure amount margin cannot be generated. Therefore, the SRAFs are not SRAFs optimized for patterns actually arranged on an LSI. Further, in a process of polygonization for generating SRAFs from the coherence map Φ, deterioration in accuracy with respect to a degree of process margin improvement occurs depending on a type of a mask layout.

BRIEF DESCRIPTION OF THE DRAWINGS

FIGS. 7A, 7B, 7C, and 7D are diagrams for explaining, using a custom illumination shape, an isolated pattern extending in the X direction;

DETAILED DESCRIPTION

Figure 1:
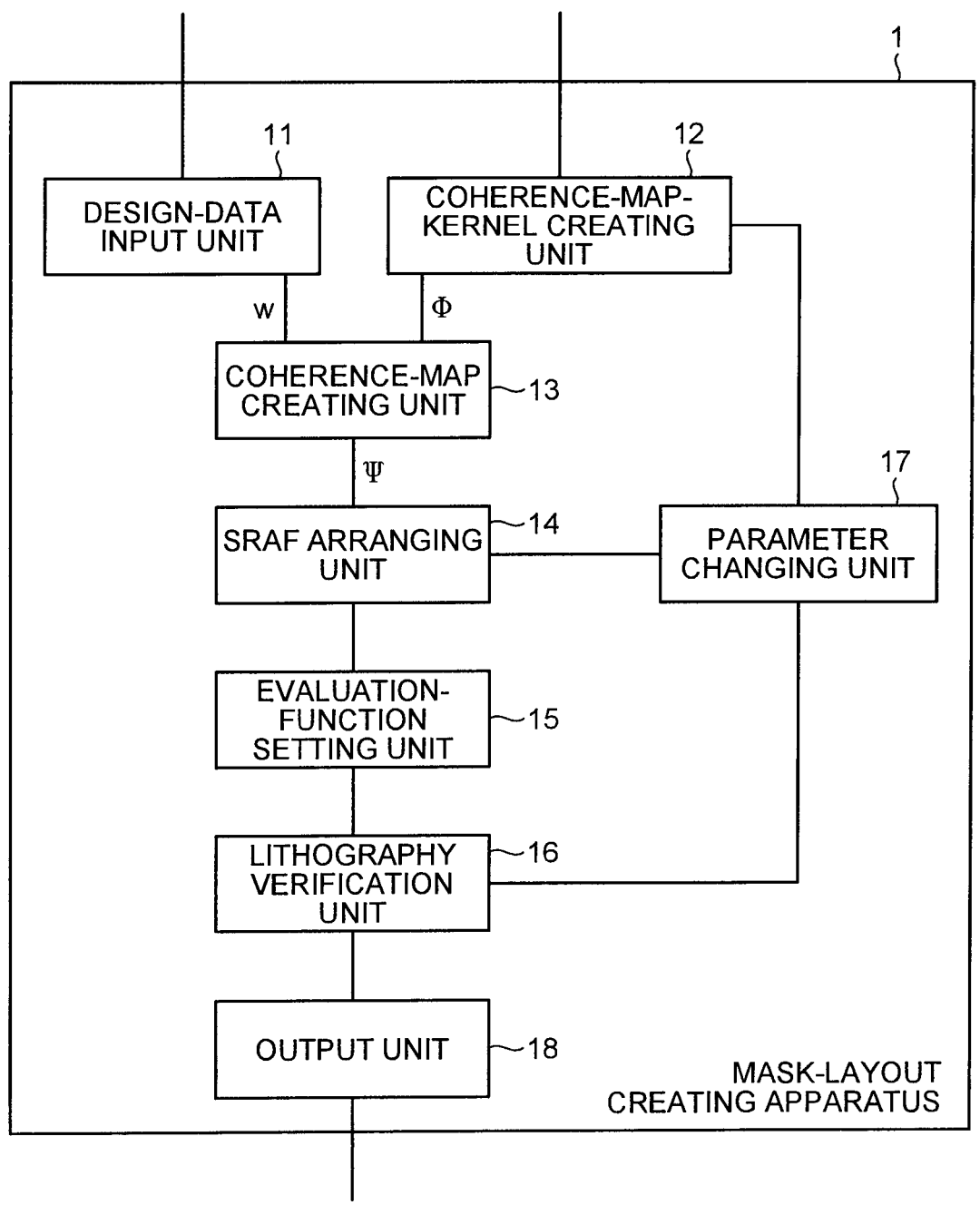
FIG. 1 is a block diagram of the configuration of a mask-layout creating apparatus according to a first embodiment.

In general, according to one embodiment, a mask-layout creating method for generating, using a coherence map method, a mask layout in which an auxiliary pattern is formed with respect to a design layout includes: setting a design layout highly likely to be a dangerous point in a lithography process; setting, with respect to the set design layout, a coherence map kernel to generate the mask layout; creating, based on the set coherence map kernel and the set design layout, the coherence map; extracting the auxiliary pattern from the created coherence map, shaping the auxiliary pattern, and generating the mask layout; defining a cost function for evaluating an optimization degree of the mask layout and evaluating the generated mask layout using the cost function; and changing, to improve the evaluated optimization degree of the mask layout, at least one of parameters in setting the coherence map kernel and parameters in extracting and shaping the auxiliary pattern.

Exemplary embodiments of a mask-layout creating method, a mask-layout creating apparatus, and a computer program product will be explained below in detail below with reference to the accompanying drawings. The present invention is not limited to the following embodiments.

Terms used in this specification are defined. "Design layout" indicates a circuit pattern written by a designer and not subjected to optical proximity correction (OPC) and other processing. "Layout" indicates a drawing of the circuit pattern and a layout in general meaning. "Mask layout" indicates a layout in which SRAFs are simply arranged with respect to the design layout. "Mask pattern" indicates a mask shape obtained by subjecting the mask layout to the OPC processing. The mask pattern is transferred onto a mask for lithography and used for exposure.

The inventor found through earnest researches that two points explained below are useful for improving accuracy of model-base SRAF arrangement employing the coherence map method. A first point is improvement of accuracy of a coherence map kernel. A second point is improvement of accuracy of a process for extracting, from a coherence map, SRAFs "m" from which SRAFs can be manufactured as a mask and shaping the SRAFs "m".

In this embodiment, to improve accuracy of the model-base SRAF arrangement employing the coherence map method, a design layout highly likely to be a dangerous point in a lithography process (a hot spot pattern) is set and a coherence map kernel (a physical model) for generating a mask layout is set with respect to the set design layout. A coherence map is created based on the set coherence map kernel and the set design layout. SRAFs are extracted from the coherence map and shaped to generate a mask layout. The OPC processing is applied to the mask layout according to necessity to create a mask pattern. A cost function COST for evaluating an optimization degree of the mask layout is defined. A mask layout extracted using the mask pattern subjected to the OPC processing is evaluated using the cost function. At least one of parameters of the coherence map kernel and parameters in extracting SRAFs from the coherence map and shaping the SRAFs are changed until the mask layout evaluated using the cost function is optimized.

Figure 2:
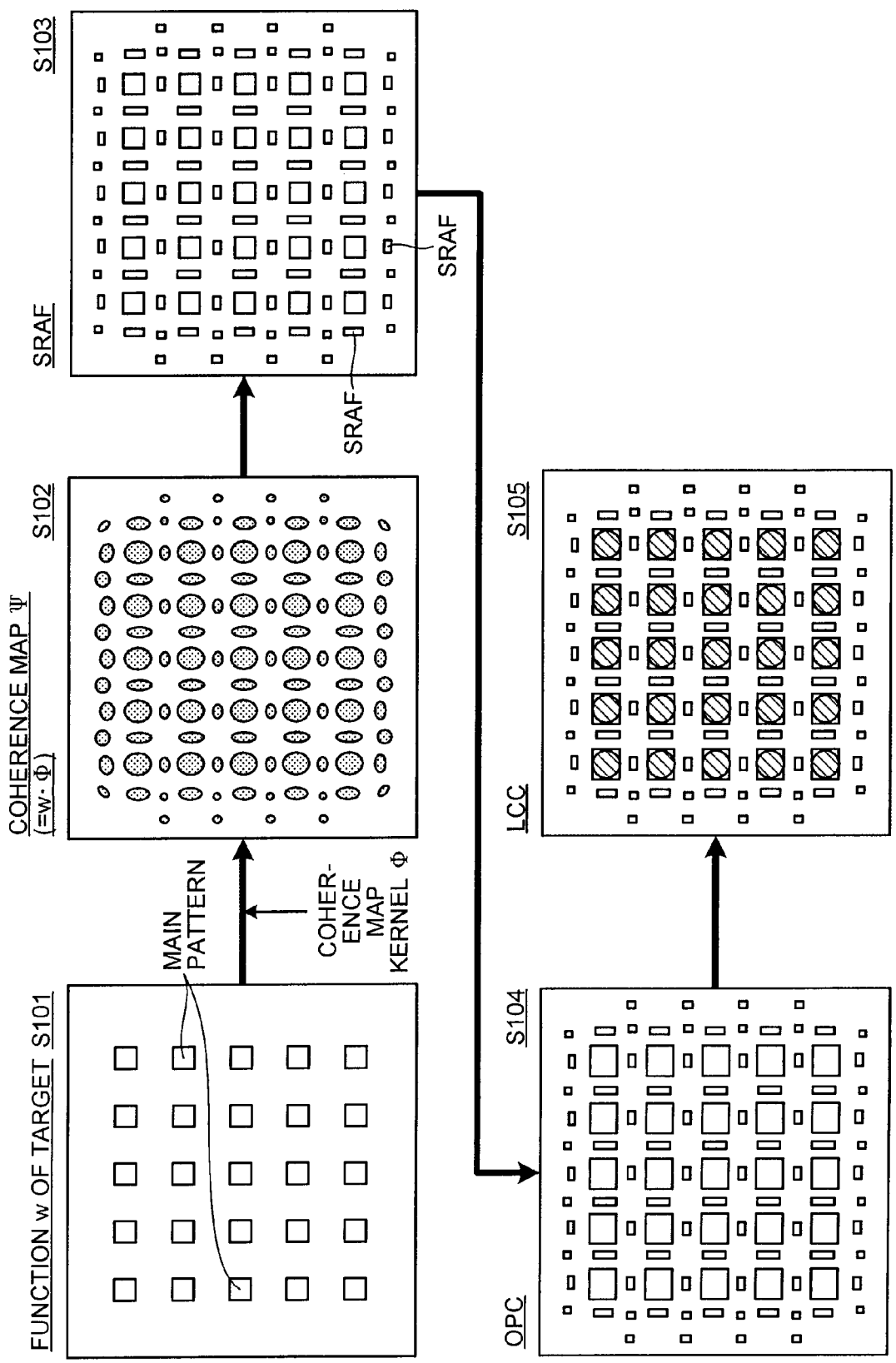
FIG. 2 is a diagram for explaining a process for generating a mask layout using a coherence map method.
Figure 3:
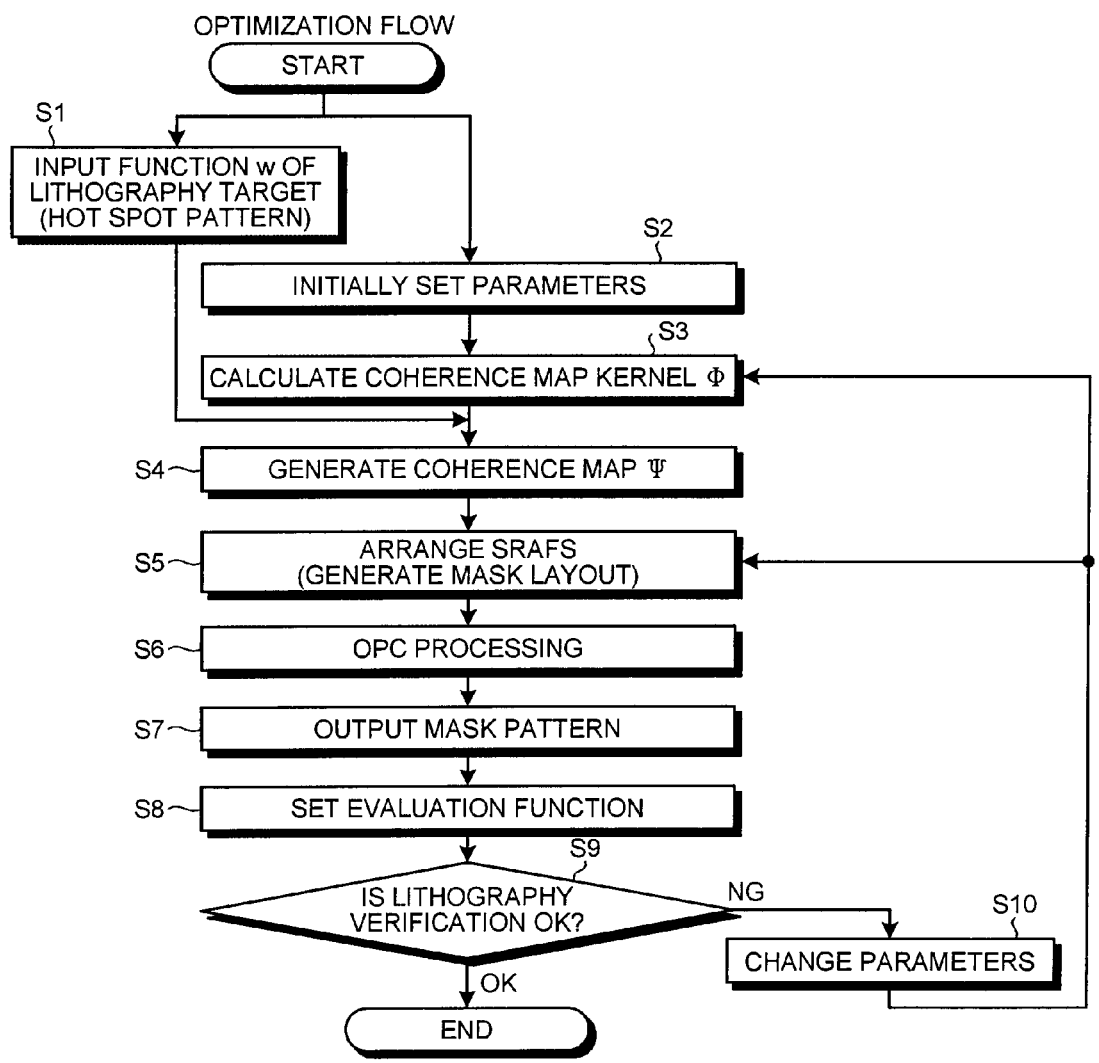
FIG. 3 is a flowchart for explaining a procedure for creating a mask layout.

FIG. 1 is a block diagram of a schematic functional configuration of a mask-layout creating apparatus according to a first embodiment. FIG. 2 is a diagram for explaining an example of a process for generating a mask layout using the coherence map method. FIG. 3 is a flowchart for explaining a procedure for optimizing the mask layout.

A mask-layout creating apparatus 1 shown in FIG. 1 is an apparatus such as computer that evaluates, using the coherence map method, a mask layout used in a lithography process for a semiconductor device and sets an optimum mask layout. In particular, the mask-layout creating apparatus 1 improves accuracy of the model-base SRAF arrangement employing the coherence map method.

The mask-layout creating apparatus 1 includes a design-data input unit 11, a coherence-map-kernel creating unit 12, a coherence-map creating unit 13, an SRAF arranging unit 14, an evaluation-function setting unit 15, an OPC processing and lithography verification unit 16, a parameter changing unit 17, and an output unit 18. The design-data input unit 11 receives input (setting) of a function w of a lithography target created using a design layout (see S101 in FIG. 2). The function w is a figure for adjusting the size of the lithography target to appropriate size. The function w indicates a figure obtained by reducing or expanding the lithography target size. For example, a lithography target having size of 100 nm×100 nm is converted into a lithography target having size of 90 nm×90 nm. A coherence map calculation is carried out based on the function w obtained through such a reduction or expansion process. As the lithography target, a design layout highly likely to be a dangerous point in a lithography process (a hot spot pattern) can be selected.

The coherence-map-kernel creating unit 12 initially sets, based on, for example, conditions of a stepper and a scanner, parameters characterizing a coherence map kernel Φ (e.g., a coherence factor σ of a light source, a numerical aperture NA, a focus position, and parameters explained later used for adjustment of a coherence map) and calculates, based on the set parameters, the coherence map kernel Φ. When the parameters are changed by the parameter changing unit 17, the coherence-map-kernel creating unit 12 calculates the coherence map kernel Φ using the changed parameters.

The coherence-map creating unit 13 creates a coherence map Ψ using the function w of the lithography target input to the design-data input unit 11 and the coherence map kernel Φ (see S102 in FIG. 2). The coherence map Ψ is a map indicating coherence of a projection optical system and indicates a distribution (distribution information) of degrees of influence on resolution performance of a product mask pattern. The degrees of influence on resolution performance include process margins.

The SRAF arranging unit 14 extracts SRAFs, with which a mask can be manufactured, from a coherence map Ψ created by the coherence-map creating unit 13, shapes the SRAFs, and generates a mask layout in which the SRAFs are arranged (S103 in FIG. 2). When the parameters are changed by the parameter changing unit 17, the SRAF arranging unit 14 generates a mask layout using the changed parameters. Further, the SRAF arranging unit 14 applies the OPC processing to the mask layout to generate a mask pattern (see S104 in FIG. 2).

The evaluation-function setting unit 15 sets a cost function COST for evaluating an optimization degree of the mask layout (the mask pattern).

The lithography verification unit 16 applies lithography verification to the mask pattern generated by the SRAF arranging unit 14 using the cost function set by the evaluation-function setting unit 15 and determines whether there is a hot spot or mask constraint violation in the mask pattern.

When the lithography verification unit 16 determines that there is a hot spot or mask constraint violation in the mask pattern, the parameter changing unit 17 changes the parameters of the coherence map kernel Φ, changes the parameters used by the SRAF arranging unit 14 in extracting and shaping SRAFs, and optimizes the parameters to eliminate the hot spot or the mask constraint violation in the mask pattern. Details of processing for optimizing the parameters by the parameter changing unit 17 are explained later.

When it is determined that there is no hot spot and mask constraint violation in the mask pattern, the output unit 18 outputs the mask pattern as a mask pattern for forming a product pattern. A photomask is created using the output mask pattern and lithography compliance check (LCC) processing is performed (see S105 in FIG. 2).

A procedure in which the pattern creating apparatus 1 having the above configuration optimizes a mask layout is explained below with reference to FIG. 3. As an algorithm used for the optimization, a local optimization method (an optimization method including a Polytope method) or other optimization methods (a Simulated Annealing method, a genetic algorithm, etc.) can be used.

In FIG. 3, first, the design-data input unit 11 generates the function w of a lithography target using a design layout and outputs the function w to the coherence-map creating unit 13 (step S1). As the lithography target, for example, a hot spot pattern can be selected.

On the other hand, the coherence-map-kernel creating unit 12 initially sets, based on, for example, conditions of a stepper, parameters characterizing the coherence map kernel Φ (e.g., σ, NA, X/Y, and EL/DoF) (step S2). The coherence-map-kernel creating unit 12 calculates, based on the set parameters, the coherence map kernel Φ and outputs the coherence map kernel Φ to the coherence-map creating unit 13 (step S3).

The coherence-map creating unit 13 generates the coherence map Ψ (Ψ=w⊗Φ: "⊗" indicates convolution) using the function w of the lithography target and the coherence map kernel Φ and outputs the coherence map Ψ to the SRAF arranging unit 14 (step S4).

The SRAF arranging unit 14 extracts SRAFs from the coherence map Ψ created by the coherence-map creating unit 13, shapes the SRAFs, and generates a mask layout (step S5). Further, the SRAF arranging unit 14 applies the OPC processing to the mask layout (step S6) and generates a mask pattern (step S7).

The evaluation-function setting unit 15 sets the cost function COST for evaluating an optimization degree of the mask layout (step S8). Details of the cost function COST are explained later.

The lithography verification unit 16 applies, using the cost function set by the evaluation-function setting unit 15, lithography verification (e.g., check of margins such as focus and dose) to the mask pattern created by the SRAF arranging unit 14 and determines whether there is a hot spot or a portion violating mask constraints in the mask pattern (step S9). When it is determined that there is no hot spot and portion violating mask constraints in the mask pattern ("OK" at step S9), the mask pattern determined as including no hot spot and portion violating mask constraints is set as a mask pattern for forming a product pattern.

When the lithography verification unit 16 determines that there is a hot spot or a portion violating mask constraints in the mask pattern ("NG" at step S9), the parameter changing unit 17 changes the parameters used by the coherence-map-kernel input unit 12 in calculating the coherence map kernel Φ and the parameters used by the SRAF arranging unit 13 in extracting and shaping the SRAFs and optimizes the parameters to thereby eliminate the hot spot or the mask constraint violation in the mask pattern (step S10). Details of a method of optimizing the parameters are explained later. When the parameter changing unit 17 changes the parameters, the coherence-map-kernel creating unit 12 calculates the coherence map kernel Φ using the changed parameters (step S3). When the parameter changing unit 17 changes the parameters, the SRAF arranging unit 14 generates a mask layout using the changed parameters (step S5). After the calculation of the coherence map kernel Φ and the generation of the mask layout based on the changed parameters are performed, the lithography verification is performed again. The processing at steps S3 to S10 is repeated until it is determined that there is no hot spot and mask constraint violation in the mask pattern. Consequently, the parameters are optimized and the mask layout is optimized.

The cost function for evaluating an optimization degree of the mask layout is selected as a function indicating robustness against an assumed process variation. An example of the cost function is indicated by Formula (3).

$$\text{Cost} = \sum_{\text{EvaluationPoints}} \text{Weight}_{\text{EvaluationPoints}} \sum_{PW} \text{Weight}_{PW} PVband_{PW}^p \quad (3)$$

In the cost function indicated by Formula (3), cost is calculated for each evaluation point based on a shift from a circuit pattern set as a target of a mask pattern when a process variation occurs (edge placement error: EPE). In Formula (3), p is an appropriate positive numerical value. By setting p to a large value, the cost function can be set to a cost function obtained by particularly evaluating an EPE in the worst case. On the other hand, by setting p to a small value, the cost function can be set to a cost function for improving the EPE on average concerning all patterns.

When the inventor performed an experiment for adjusting tuning parameters using cost functions corresponding to various values of p, it was found that calculation accuracy with respect to improvement of process margins was improved by setting p to a large value and, on the other hand, the TAT tended to increase. An optimum value of p needs to be determined from accuracy and the specification of the TAT. It is possible to improve the TAT and the accuracy of parameter adjustment by using the optimized p.

In this embodiment, a function defined from an exposure amount and a fluctuation amount of a pattern dimension with respect to fluctuation in focus is selected as the cost function Cost. PV band indicates each process variation, for example, the exposure amount and the fluctuation amount of the pattern dimension with respect to fluctuation in focus. The process variations totaled at each evaluation point are set as cost. When p is set to a large value, optimization is performed to reduce range width of the PV band of each pattern. When p is set to a small value, optimization is performed to reduce a σ value of the PV band of each pattern. As a result of an examination, it was found that a proper result can be obtained by setting p to a value of about 2.

To optimize the mask layout, as explained above, the improvement of accuracy of the coherence map kernel Φ and the improvement of accuracy of the step for extracting SRAFs from the coherence map Ψ and shaping the SRAFs are performed. It is possible to optimize the mask layout by executing at least one of the improvement of accuracy of the coherence map kernel Φ and the improvement of accuracy of the step for extracting SRAFs from the coherence map Ψ and shaping the SRAFs.

Figure 4:
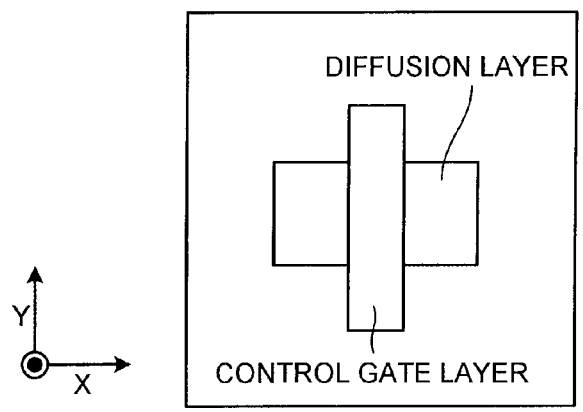
FIG. 4 is a diagram for explaining margin specifications in an X direction and a Ψ direction.
Figure 5:
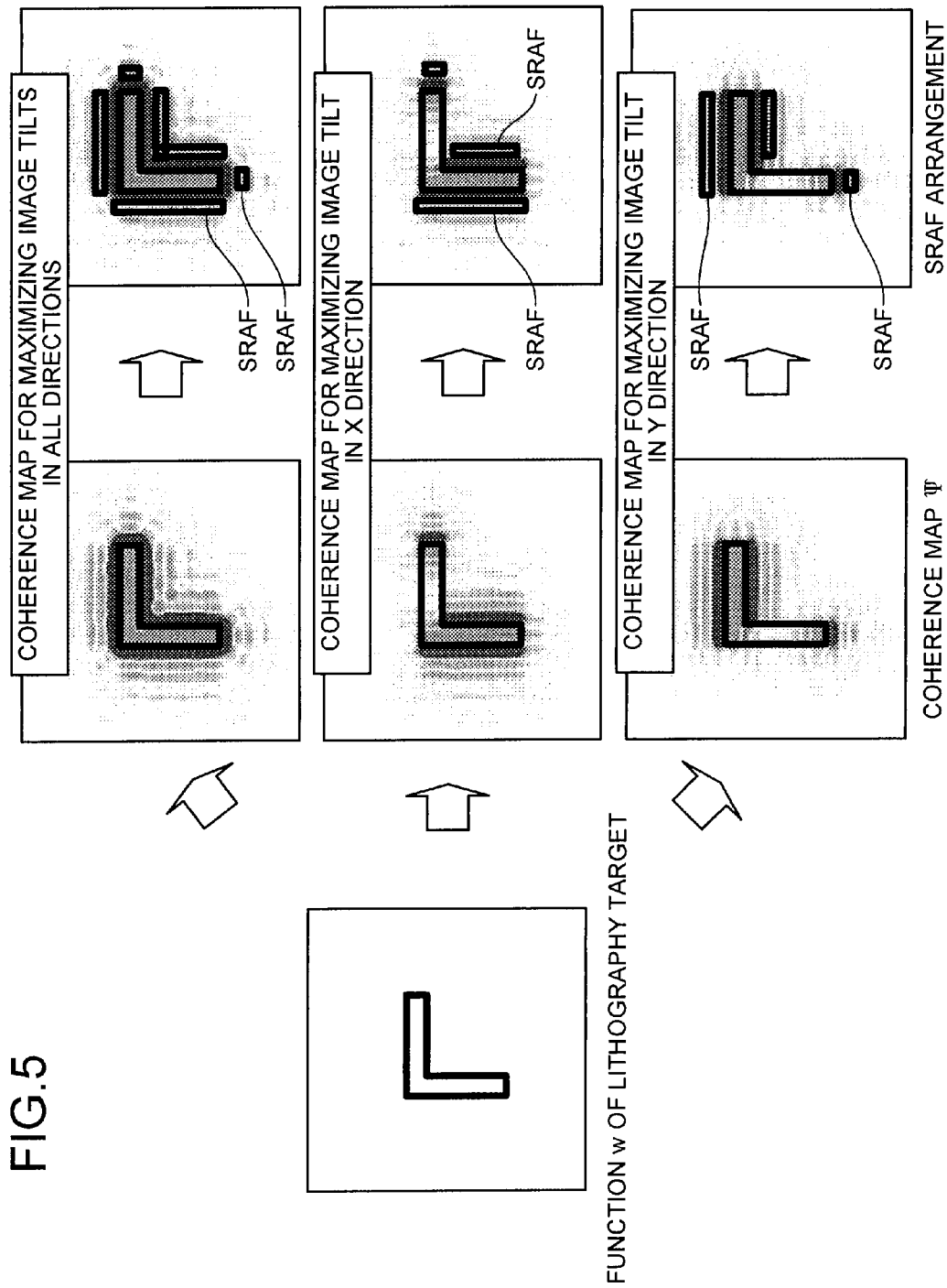
FIG. 5 is a diagram for explaining coherence maps for respectively maximizing slopes of aerial image in all the directions, the X direction, and the Ψ direction.
Figure 6:
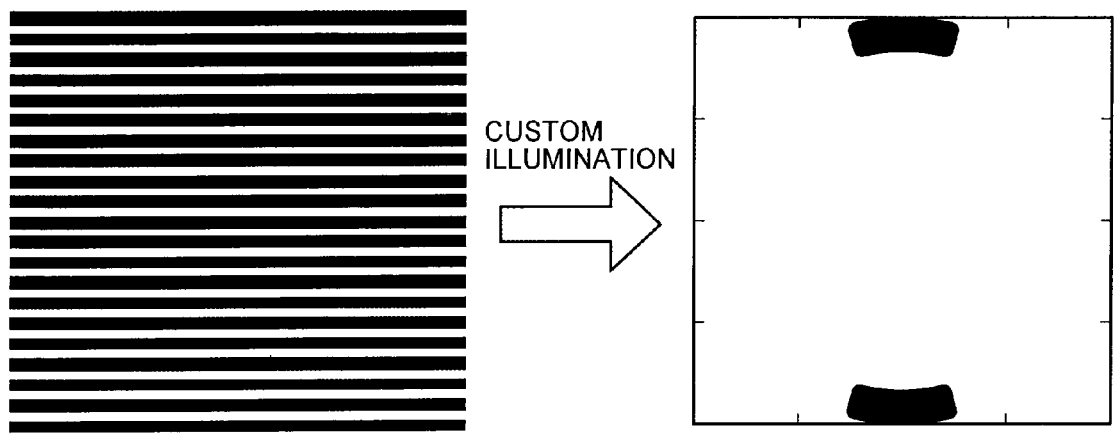
FIG. 6 is a diagram for explaining a coherence map during extreme off-axial illumination.

Correction of X-Y anisotropy is explained with reference to FIGS. 4 to 7. FIG. 4 is a diagram for explaining an example in which different critical dimension (CD) margin specifications are requested in an X direction and a Ψ direction. FIG. 5 is a diagram for explaining coherence maps Ψ for respectively maximizing slopes of aerial image in pattern boundaries in all the directions, the X direction, and the Ψ direction. FIG. 6 is a diagram for explaining a coherence map during extreme off-axial illumination. FIGS. 7A, 7B, 7C, and 7D are diagrams for explaining situations in which an isolated pattern extending in the X direction is formed using a custom illumination shape.

As disclosed in United States Patent Application Publication No. 2008/0301620, the coherence map kernel Φ can be represented by the following Formula (4):

$$\Phi = FT^{-1}[(\xi^2 + \eta^2)\phi_0(-\xi, -\eta)] \quad (4)$$

where, $FT^{-1}$ indicates inverse Fourier transform and $\phi_0$ indicates an eigenfunction of a maximum peculiar value obtained when a mutual transmission coefficient (see "H. H. Hopkins, On the diffraction theory of optical images, Proc. Roy. Soc. London Ser. A, no. 217 (1953): p. 408", "Born & Wolf in Principles of Optics, 4$^{th}$ edition (Pergamon Press, 1970), in Section 9.2, pp. 464-467", "H. Gamo, Matrix Treatment of Partial Coherence, in Progress In Optics v. 3, ed. Emil Wolf (North-Holland, 1964), p. 187", "Y. C. Pati and T. Kailath, Phase-shifting masks for microlithography: automated design and mask requirements, J. Opt. Soc. Am. A 11, no. 9 (1994): p. 2438", "N. B. Cobb and A. Zakhor, A mathematical and CAD framework for proximity correction, in SPIE v. 2726 Optical Microlithography IX, ed. Gene E. Fuller (SPIE, 1996), p. 208", and "Alan E. Rosenblutha, Gregg Gallatina, Ronald L. Gordonb, William Hinsbergc, John Hoffnaglec, Frances Houlec, Kafai Laib, Alexey Lvova, Martha Sanchezc, Nakgeuon Seong, Fast calculation of images for high numerical aperture lithography, Proceedings of SPIE 5377, 615 (2004).") is subjected to singular-value decomposition. The coherence map Ψ(x,y) is defined by the following Formula (5):

$$\Psi(x,y) = \int dx' dy' m(x',y') \Phi(x-x', y-y') \quad (5)$$

where, m is a mask function. In Japanese Patent Application laid-open No. 2008-76682, it is indicated that SRAFs arranged in an area of Ψ(x,y)>0 increase a slope of aerial image in a pattern boundary (dI/dx with respect to a pattern edge extending in a y direction and dI/dy with respect to a pattern edge extending in an x direction).

Actually, it is possible to improve the slope of aerial image by using the coherence map kernel Φ. However, the inventor found that, in this method, there is a problem in that SRAF arrangement accuracy is not so high when an optical system has anisotropy. For example, the problem occurs when a light source shape of lithography illumination is extremely asymmetrical (e.g., dipole illumination). In this case, a situation occurs in which a slope of aerial image in a pattern boundary direction extending in a certain direction (e.g., dI/dx of the pattern edge extending in the y direction) is sufficiently large, i.e., a process margin is sufficiently large but a slope of aerial image in a pattern boundary direction extending in another direction (e.g., dI/dy of the pattern edge extending in the x direction) is not sufficient, i.e., a process margin is small. The size of the process margin depends on a process margin of an area where the process margin is the smallest. Therefore, a problem occurs when there is a portion where the process margin is insufficient in this way.

The inventor found that there is a problem in that SRAF arrangement accuracy is not so high either when a light source shape has no anisotropy. For example, depending on a pattern type, a CD margin specification in the X direction and a CD margin specification in the Y direction are often substantially different. For example, in FIG. 4, a diffusion layer and a control gate layer of a general transistor are schematically shown. In the figure, when a pattern of the control gate layer is considered, the CD margin specification in the X direction is required to be a strict specification because the CD margin specification in the X direction substantially affects an operation characteristic of the transistor. On the other hand, the CD margin specification in the Ψ direction is required to be a gentle specification compared with that in the X direction. Because of such a background, a situation occurs in which, even if a process margin in the Y direction is sufficiently satisfied, a process margin in the X direction is insufficient. The size of the process margin depends on a process margin in an area where the process margin is the smallest. Therefore, a problem occurs when there is a portion where the process margin is insufficient in this way.

To solve such an X-Y anisotropy problem, the inventor considered correcting the coherence map kernel of Formula (4) as indicated by the following Formula (6):

$$\Phi = FT^{-1}[(c_x\xi^2 + c_y\eta^2)\phi_0(-\xi, -\eta)] \quad (6)$$

where, $c_x$ and $c_y$ are parameters to be adjusted. When $c_x=1$ and $c_y=0$, SRAFs to be extracted have an effect of increasing only the slope of aerial image dI/dx of the pattern boundary extending in the y direction. When $c_x=0$ and $c_y=1$, SRAFs to be extracted have an effect of increasing the slope of aerial image dI/dy of the pattern boundary extending in the x direction. It is possible to solve the X-Y anisotropy problem by adjusting $c_x$ and $c_y$ to optimum values.

In an example shown in FIG. 5, a different coherence map Ψ can be calculated according to the direction of a CD margin specification to which importance is attached with respect to a target. The coherence map Ψ obtained when tilt angles in all the directions (the X direction and the Y direction) are maximized, the coherence map Ψ obtained when the tilt angle in the X direction is maximized, and the coherence Ψ obtained when the tilt angle in the Y direction is maximized are shown. As shown in FIG. 5, it is possible to calculate various coherence maps Ψ by adjusting values of $c_x$ and $c_y$. $C_x$ and $c_y$ are used as parameters for adjusting the coherence map kernel Φ. This makes it possible to create a mask layout having robustness with margin specifications flexibly taken into account for the mask layout.

Adjustment of the coherence map kernel Φ used for generating SRAFs sufficiently satisfying process margin specifications necessary for a mask layout in an asynchronous optical system is explained. In recent years, to resolve a fine pattern, in general, extreme off-axial illumination is used for an illumination shape of an exposing device. Further, not only an illumination shape having high spatial symmetry such as annular illumination but also an illumination shape having low spatial symmetry such as quadruple pole illumination and double pole illumination is used in recent years. A problem of application of the coherence map method in the past is explained below with reference to the double pole illumination as an example.

For example, to resolve a micro-pitch wire extending in the X direction shown on the left of FIG. 6, optimized double pole illumination shown on the right of FIG. 6 is used. In the following explanation, it is assumed that it is necessary to simultaneously form an isolated pattern (FIG. 7A) extending in the X direction using this custom illumination shape.

A calculation result (in the case of $c_x=1$ and $c_y=1$) obtained when model-base SRAFs are arranged with respect to the isolated wiring pattern using the coherence map (SGM) of United States Patent Application Publication No. 2008/0301620 is shown in FIG. 7B. As it is seen from the figure, as the mode base SRAFs calculated in this way, only model-base SRAFs that improve a CD margin in the Y direction are calculated. Model-base SRAFs that improve a CD margin in the X direction cannot be calculated. This means that it is difficult to apply a model-base SRAF arranging method in the past in the double pole illumination.

On the other hand, as in this embodiment, SRAFs are arranged using the coherence map Ψ in which importance is attached to improvement of the CD margin in the X direction. Specifically, the coherence map Ψ in the case of $c_x > c_y$ is calculated.

In FIG. 7C, the coherence map Ψ in the case of cx=1 and cy=0 is shown. SRAF arrangement for improving a margin in the X direction can be calculated. In FIG. 7D, the coherence map Ψ in the case of cx=1 and cy=0.2 is shown (referred to as improved SGM method). It is found that SRAFs that improve the CD margin in the Ψ direction and SRAFs that improve the CD margin in the X direction can be simultaneously calculated. By using the improved SGM in this way, it is possible to further improve CD margins than the SRAF arrangement in the past.

Correction of El/DoF unbalance is explained with reference to FIGS. 8 and 9. FIG. 8 is a diagram for explaining a focus margin and an EL margin of an isolated hole and a dense pitch hole. FIG. 9 is a graph for explaining a relation between defocus and peak intensity of coherence map kernels Φ created under different focus conditions.

SRAFs extracted by the methods disclosed in United States Patent Application Publication No. 2008/0301620, Japanese Patent No. 3992688, Japanese Patent Application Laid-Open No. 2008-40470, Japanese Patent Application Laid-Open No. 2008-76682, United States Patent Application Publication No. 2004/0229133A1, United States Patent Application Publication No. 2005/0142270A1, United States Patent Application Publication No. 2008/0052334A1, and "R. Socha et al., Proc. SPIE 5377 (2004), pp. 222-pp. 240" has an effect of improving any one of robustness against exposure amount fluctuation (exposure latitude: EL) and robustness against focus fluctuation (depth of focus: DoF) or both. However, it cannot always be said that the SRAFs are SRAFs optimum for fitting within specifications simultaneously required in both the EL and the DoF. Therefore, an optimization design method for the coherence map kernel Φ for fitting within the specifications simultaneously required in both the EL and the DoF is examined.

Figure 8A:
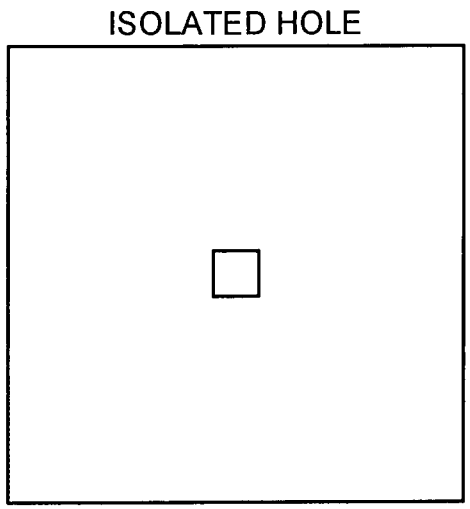
FIGS. 8A and 8B are diagrams for explaining a focus margin and an EL margin of an isolated hole and a dense pitch hole.
Figure 8B:
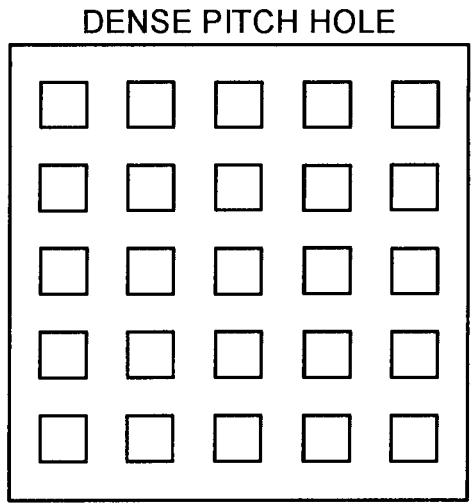
Figure 9:
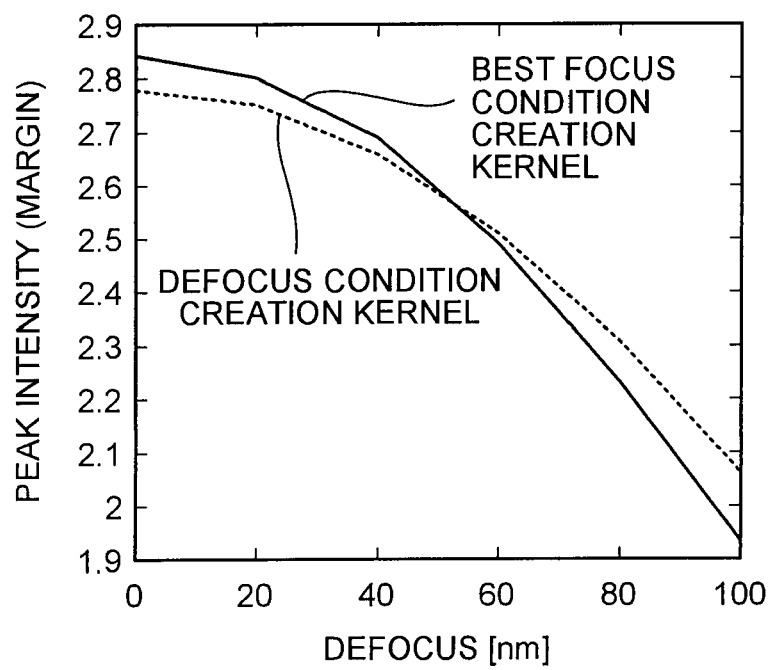
FIG. 9 is a graph for explaining a relation between defocus and peak intensity of coherence map kernels Φ created under different focus conditions.

For example, as shown in FIG. 8A, the focus margin tends to be insufficient in the isolated hole. As shown in FIG. 8B, the exposure amount margin tends to be insufficient in the dense pitch hole. It is necessary to calculate the coherence map kernel Φ for performing layout design having a focus margin simultaneously with an exposure amount with respect to a layout. The inventor obtained the knowledge explained below concerning a method of calculating the coherence map kernel Φ that enables SRAF design for improving the focus margin.

FIG. 9 is a graph plotted with slopes of aerial image (physical amounts related to a margin of an exposure amount) with respect to focus fluctuation of a mask layout obtained by applying SRAF design to an isolated hole layout using the coherence map method under certain Quasar illumination conditions. Slopes of aerial image for which an optical condition in calculating the coherence map kernel Φ is a best focus condition and slopes of aerial image for which the optical condition is a defocus condition are shown. As shown in the figure, it was found that SRAFs created based on the coherence map kernel Φ created under the best focus condition has a high exposure amount margin but has a low focus margin. On the other hand, it was found that SRAFs created based on the coherence map kernel Φ created under the defocus condition has a high focus margin but has a low exposure amount margin. The inventor confirmed that, by adjusting the focus condition for calculating the coherence map kernel Φ, it is possible to calculate the coherence map kernel Φ for generating a mask layout robust against both an exposure amount and focus fluctuation.

Specifically, the inventor considered optimizing the function $\Phi_0$ of Formula (4) or (6) to optimize the coherence map kernel Φ. The function $\Phi_0$ is calculated based on information concerning optical conditions of an exposing device such as partial coherence, aberration, pupil transmittance, defocus, and an interference effect in resist stack of an optical system. Explanation of details of a specific calculation method is omitted because the specific calculation method is described in "H. H. Hopkins, On the diffraction theory of optical images, Proc. Roy. Soc. London Ser. A, no. 217 (1953): p. 408", "Born & Wolf in Principles of Optics, 4th edition (Pergamon Press, 1970), in Section 9.2, pp. 464-467", "H. Gamo, Matrix Treatment of Partial Coherence, in Progress In Optics v. 3, ed. Emil Wolf (North-Holland, 1964), p. 187", "Y. C. Pati and T. Kailath, Phase-shifting masks for microlithography: automated design and mask requirements, J. Opt. Soc. Am. A 11, no. 9 (1994): p. 2438", "N. B. Cobb and A. Zakhor, A mathematical and CAD framework for proximity correction, in SPIE v. 2726 Optical Microlithography IX, ed. Gene E. Fuller (SPIE, 1996), p. 208", and "Alan E. Rosenblutha, Gregg Gallatina, Ronald L. Gordonb, William Hinsbergc, John Hoffnaglec, Frances Houlec, Kafai Laib, Alexey Lvova, Martha Sanchezc, Nakgeuon Seong, Fast calculation of images for high numerical aperture lithography, Proceedings of SPIE 5377, 615 (2004)".

The inventor found that, in a mask layout calculated with the coherence map kernel $\Phi$ obtained when a focus state input in calculating the function $\phi_0$ is slightly defocused, DoF can be set larger although the EL is smaller compared with a mask layout calculated with the coherence map kernel $\Phi$ obtained when calculated with a nominal focus amount. When the focus state input in calculating the function $\phi_0$ is set to an optimum focus state, it is possible to calculate the coherence map kernel $\Phi$ for generating a mask layout that fits in specifications both in the EL and the DoF.

Figure 10A:
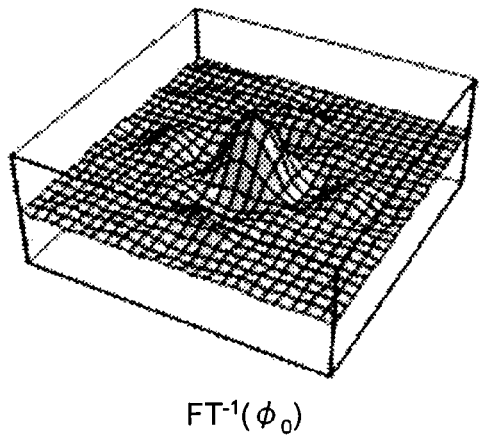
FIGS. 10A and 10B are schematic diagrams for explaining improvement of approximation accuracy of a coherence map kernel.
Figure 10B:
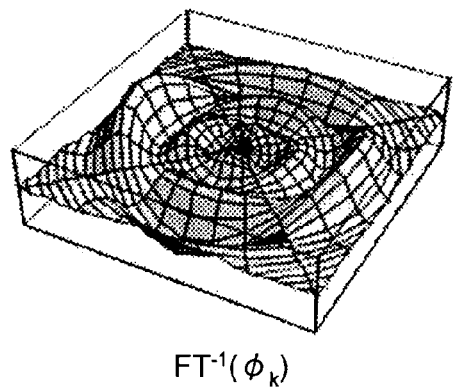

A method of improving approximation accuracy of the coherence map kernel $\Phi$ is explained with reference to FIG. 10. FIG. 10 is a schematic diagram for explaining improvement of the approximation accuracy of the coherence map kernel $\Phi$. In the embodiment, the coherence map kernel $\Phi$ is calculated as $\Phi=FT^{-1}(\phi_0)$ using a lowest order eigenfunction. On the other hand, when the coherence map kernel $\Phi$ is calculated as indicated by the following Formula (7) using not only the lowest order eigenfunction but also a high order eigenfunction and the coherence map $\Psi$ is calculated using the calculated coherence map kernel $\Phi$, it is possible to improve accuracy of model-base SRAFs to be obtained.

$$\Phi=FT^{-1}(\phi_0+c\phi_k) \quad (7)$$

where, c is a parameter representing to which degree contribution of the high order eigenfunction is reflected on a calculation result. It is possible to realize improvement of accuracy of a coherence map by adjusting c. In FIG. 10, when $FT^{-1}(c\phi_k)$ (e.g., c=0.0001) is added to $FT^{-1}(\phi_0)$, in some case, it is possible to improve approximation accuracy of the coherence map kernel $\Phi$.

Figure 11:
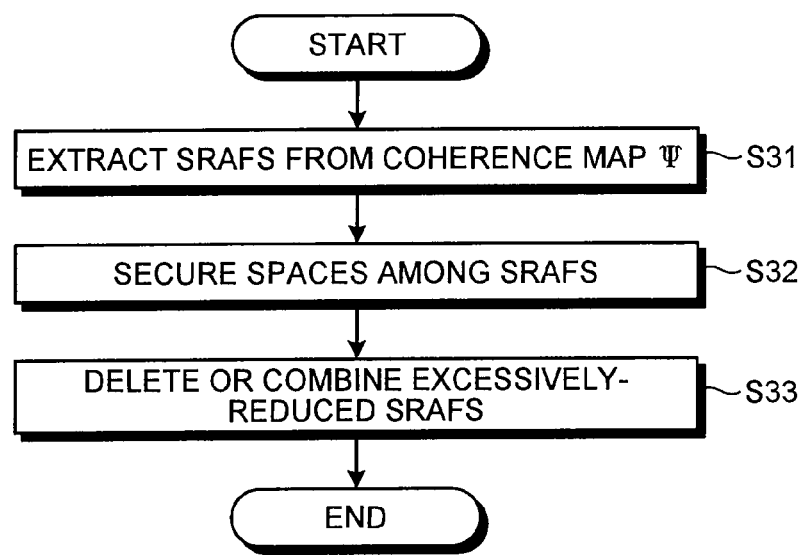
FIG. 11 is a flowchart for explaining an SRAF arrangement flow.

Improvement of accuracy of a process for extracting SRAFm from the coherence map $\Psi$ and shaping SRAFm is explained with reference to FIGS. 11 to 13.

As explained above, the coherence map $\Psi$ is calculated and, subsequently, SRAFs are extracted from the calculated coherence map $\Psi$. As an extracting method, SRAFs that are present in an area including mask areas M1, M2, M3, and M4 defined by the following Formula (8) and include mask constraints (conditions for making it easy to set, in manufacturing, the size and the position in a rectilinear polygon including vertical and horizontal segments) are extracted. $\Psi$ is obtained by allocating certain actual numerical values to coordinates (x,y) of a mask layout and $\Psi=\Psi(x,y)$.

$$M1=\{(x,y)|\Psi(x,y)>\text{threshold 1}\}$$

$$M2=\{(x,y)||d\Psi/dx|<\text{threshold 2}\}$$

$$M3=\{(x,y)||d\Psi/dy|<\text{threshold 3}\}$$

$$M4=\{(x,y)|(d\Psi/dx)^2+(d\Psi/dy)^2<\text{threshold 4}\} \quad (8)$$

where, threshold 1, threshold 2, threshold 3, and threshold 4 are certain actual numerical values.

The mask areas M1, M2, M3, and M4 are calculated by Formula (8). A common mask area $M=M1\cap M2\cap M3\cap M4$ of the mask areas is calculated. Based on information concerning the mask common area M calculated in this way, the SRAFs can be shaped to a rectilinear SRAF. By adjusting the thresholds 1 to 4 as parameters, it is possible to improve accuracy of a process for extracting SRAFm from the coherence map $\Psi$.

In general, it is known that a margin improvement effect is expected to be large but a risk of occurrence of SRAF transfer increases when a value of the threshold 1 is set small, values of the thresholds 2 to 4 are set large, and model-base SRAFs are extracted and arranged.

A method of improving accuracy of a processing for shaping the extracted SRAFs is explained. FIG. 11 is a flowchart for explaining detailed processing of the SRAF arrangement processing (step S5) shown in FIG. 3. In FIG. 11, first, the SRAF arranging unit 14 extracts SRAFs from the coherence map $\Psi$ according to the method explained above (step S31). The extracted SRAFs cannot be used as SRAFs from the viewpoint of mask constraints. Therefore, it is necessary to change the SRAFs to a shape satisfying the constraints (a rectilinear polygon).

The SRAF arranging unit 14 secures spaces among the SRAFs (step S32). In a place where the SRAF space is narrow and there is a problem in terms of the mask constraints, one or both of the SRAFs are reduced to widen the space. However, because a minimum area of the SRAFs is determined in terms of the mask constraints, the space is widened within a range of the minimum area.

The SRAF arranging unit 14 deletes the SRAFs reduced to be too small or the SRAFs having excessively narrow spaces (step S33). As a result of reducing the SRAFs in securing spaces, when the SRAFs are reduced to be too small and mask constraint violation occurs, the SRAFs are deleted. When a space is narrow and mask constraint violation occurs in a state before deleting the SRAFs, the space is filled up to combine the SRAFs.

Figure 12:
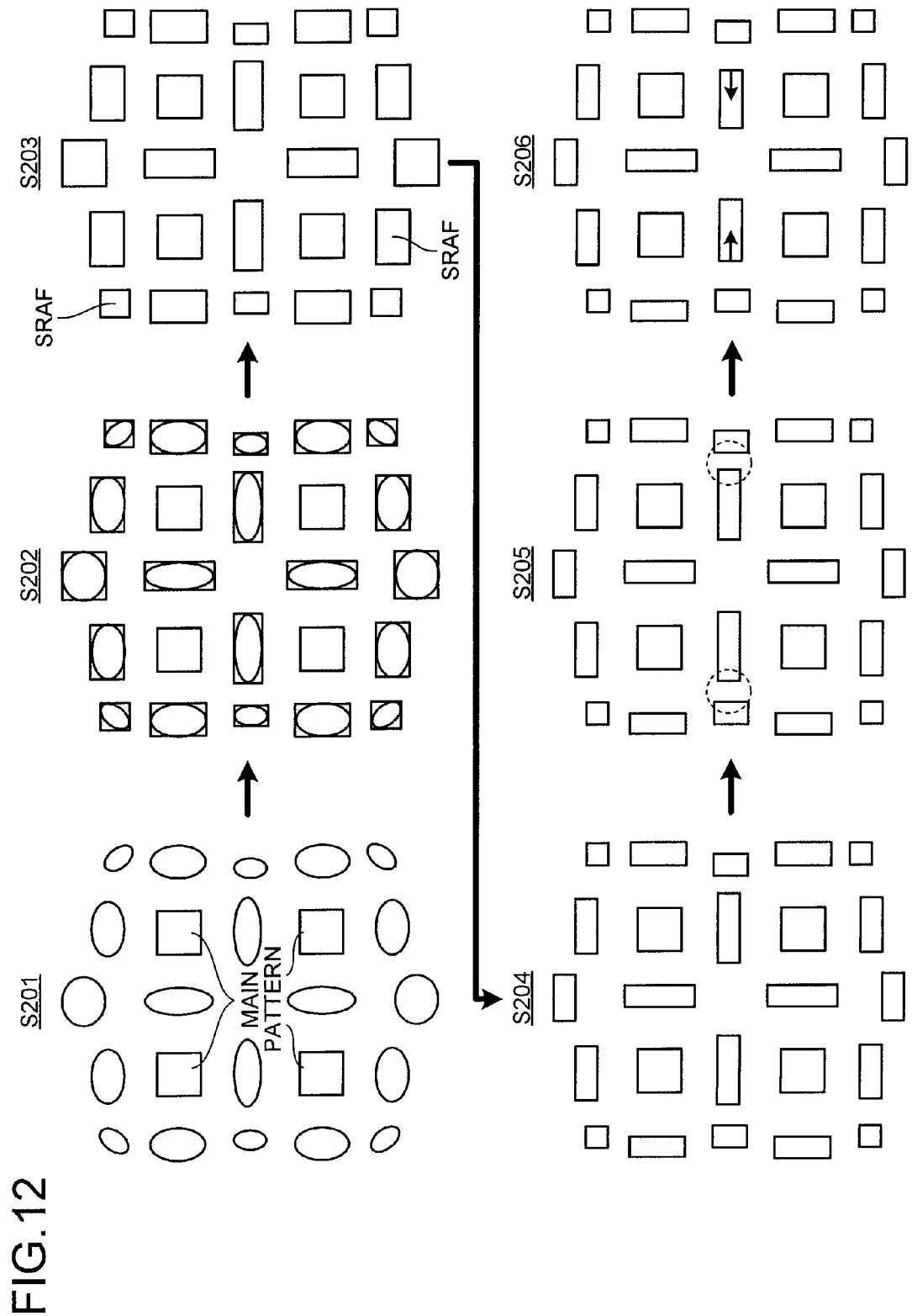
FIG. 12 is a diagram for explaining a process for extracting SRAFs.
Figure 13:
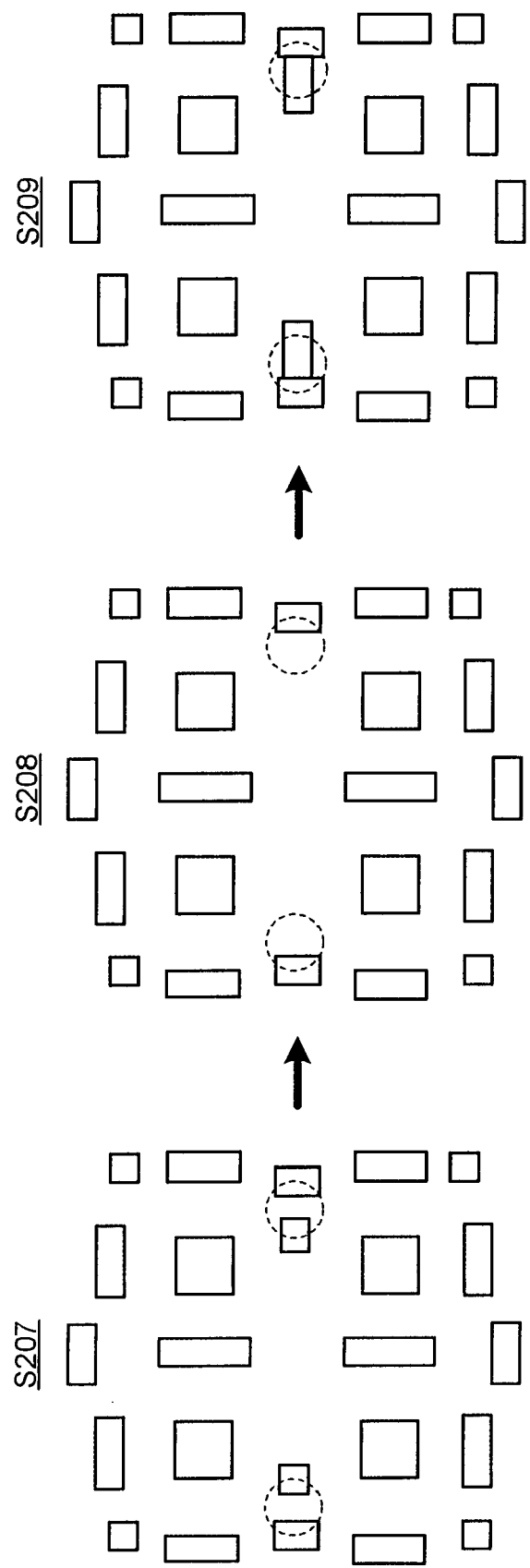
FIG. 13 is a diagram for explaining the process for extracting SRAFs.

FIGS. 12 and 13 are process charts for explaining shaping of SRAFs. In FIGS. 12 and 13, first, SRAFs are extracted from the coherence map $\Psi$ (step S201). Subsequently, the SRAFs are patterned on outer peripheral rectangles of the SRAFs (step S202). At step S203, the SRAFs and design patterns are left. The sizes of the SRAFs are adjusted (step S204). In the example shown in the figure, short sides of the SRAFs are uniformly adjusted to the same size. However, an adjusting method is not limited to this. Other adjusting methods can be used. Other publicly-known methods can be applied other than patterning the SRAFs on the outer peripheral rectangles.

Portions where SRAF spaces are narrow and mask rule constraint violation occurs are extracted (step S205). In the figure, the portions where the mask rule constraint violation occurs are indicated by circles. To widen the spaces in the violation portions, the SRAF having larger area or length is reduced (step S206). It is assumed that, because the SRAF space is narrow and the sizes of the SRAFs are small, the SRAFs are reduced to be too small and the mask rule constraint violation occurs irrespective of which SRAF is reduced (S207). In this case, one of the SRAFs is deleted (step S208). Alternatively, both or one of the SRAFs is extended to fill up the narrow space portion (step S209). It is possible to generate an optimum mask layout by shaping the SRAFs in this way.

The coherence map kernel Φ in use can be switched or an SRAF extracting and shaping method can be switched according to a type of a design layout. The coherence-map-kernel creating unit 12 prepares a plurality of the coherence map kernels Φ in advance and selects, based on feature values of a design layout, the coherence map kernel Φ. The SRAF arranging unit 14 prepares a plurality of SRAF extracting and shaping methods and selects, based on feature values of a design layout, an SRAF extracting and shaping method.

Figure 14:
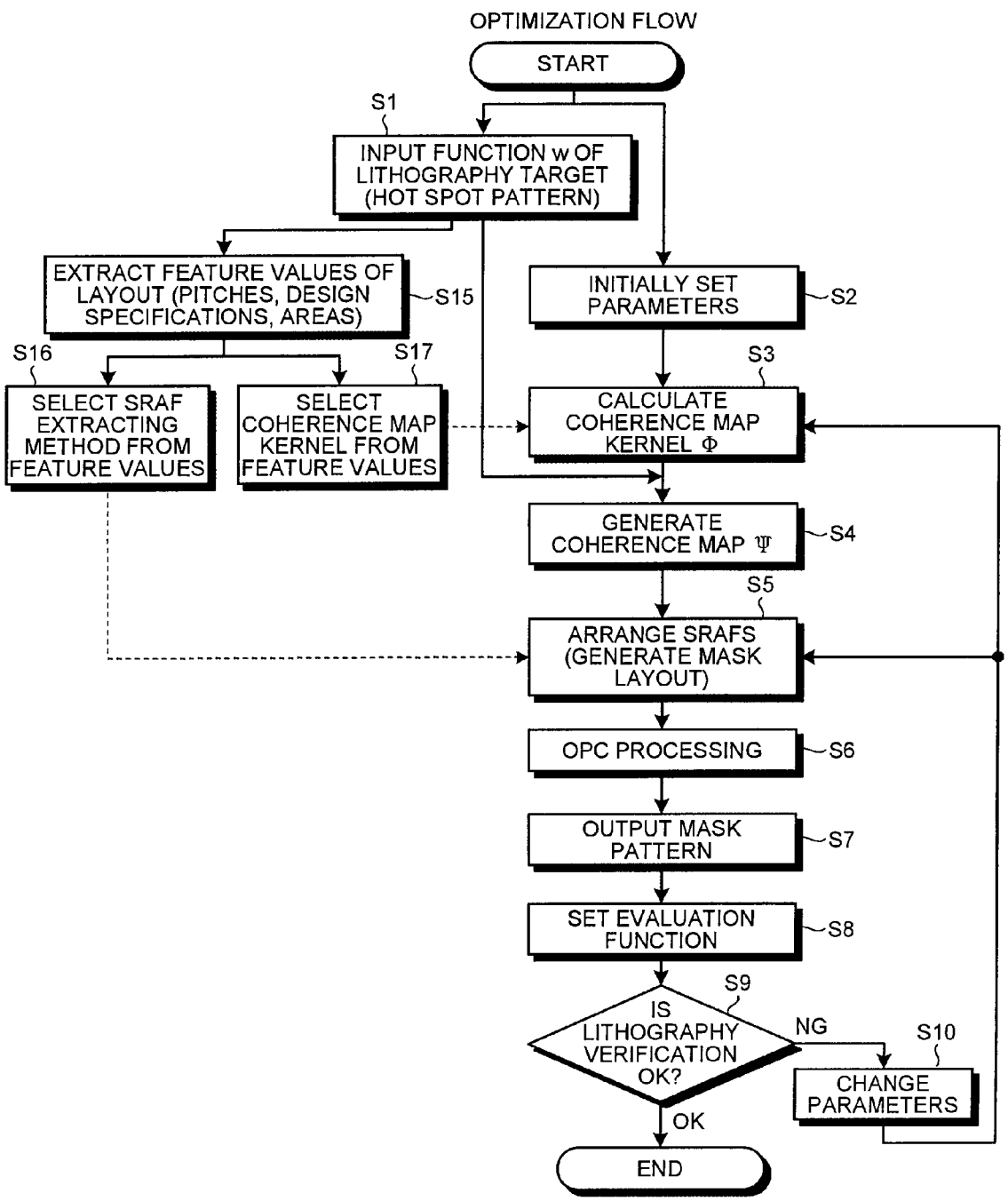
FIG. 14 is a flowchart for explaining a flow of switching the coherence map kernel Φ in use and switching an SRAF extracting method according to a type of a layout.

FIG. 14 is a flowchart for explaining a flow of switching the coherence map kernel Φ in use and switching the SRAF extracting and shaping method according to a type of a design layout. In FIG. 14, steps same as those shown in FIG. 3 are denoted by the same reference signs and explanation of the same steps is omitted.

In FIG. 14, the coherence-map-kernel creating unit 12 extracts feature values (e.g., pitches of patterns, design specifications, sizes, shapes, areas, and wiring directions) of a lithography target layout (step S15) and selects, based on the feature values of the target layout, the coherence map kernel Φ (step S17). The SRAF arranging unit 14 selects, based on the feature values of the lithography target layout, the SRAF extracting and shaping method (step S16).

For example, the coherence map kernel Φ can be switched according to areas (a cell portion and a peripheral portion), pitches of the patterns (a dense pitch portion and an isolated pitch portion), and wiring directions (the X direction and the Ψ direction). An optimum coherence map kernel Φ can be calculated depending on a layout variation and accuracy of the coherence map kernel Φ can be further improved. Specifically, in the case of a dense pitch hole, an EL-oriented coherence map kernel can be used. In the case of a sparse pitch hole, a DoF-oriented coherence map kernel can be used. Switching between mode-base SRAF arrangement and rule-base SRAF arrangement can be performed according to areas of a layout. This makes it possible to perform more optimum SRAF arrangement.

Figure 15:
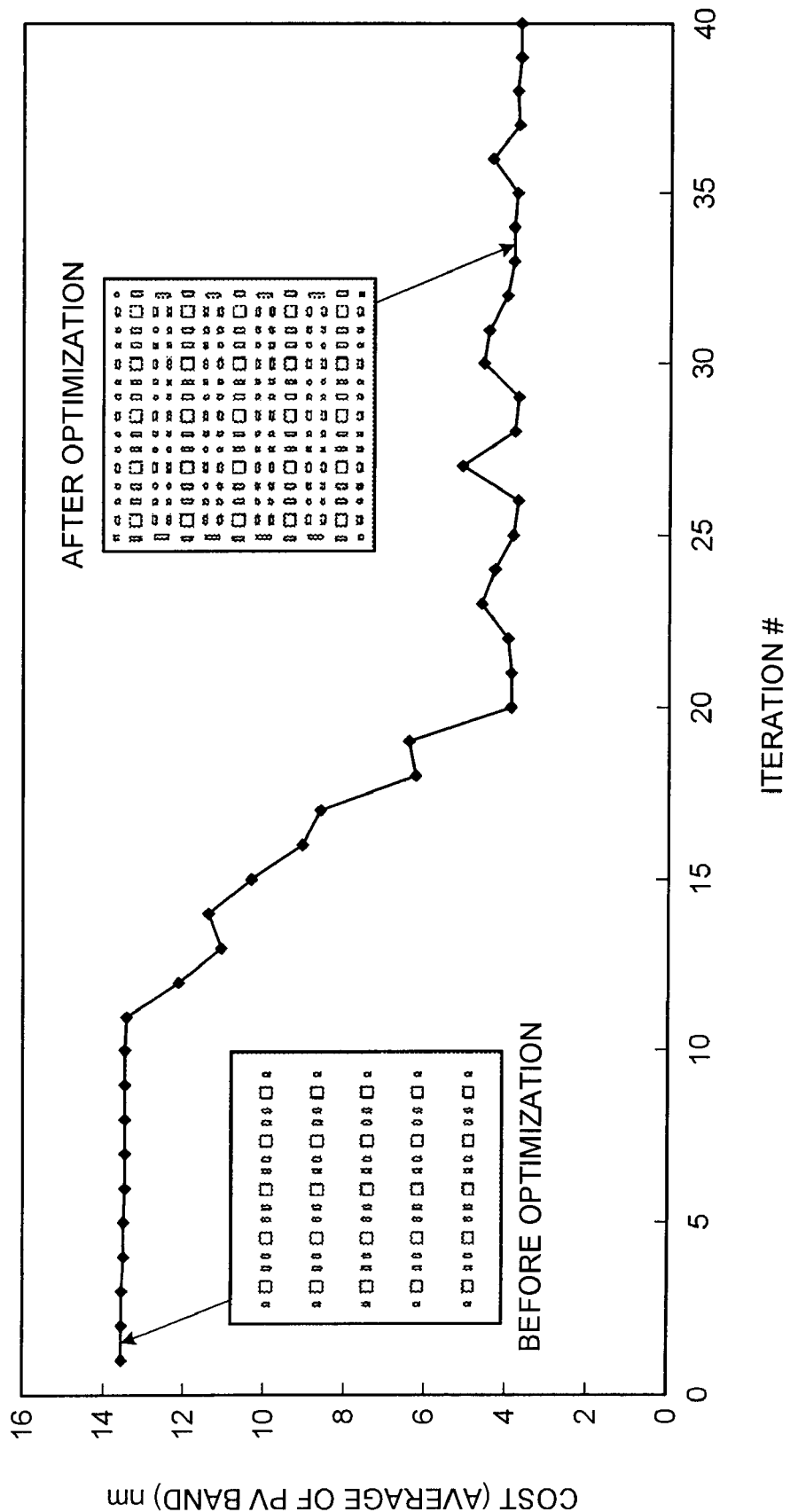
FIG. 15 is a graph of a state of a change in PV band width in each iteration (arrangement) of optimization and mask layouts before the optimization and after the optimization.
Figure 16:
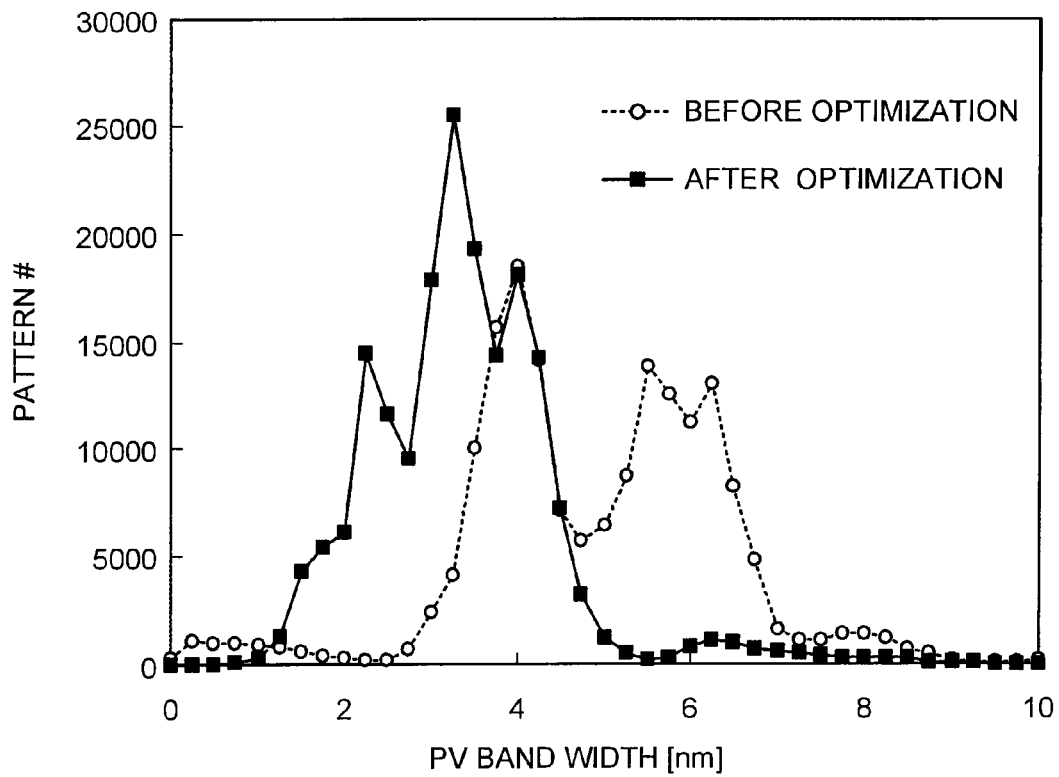
FIG. 16 is a graph of the number of patterns with respect to the PV band width.
Figure 17:
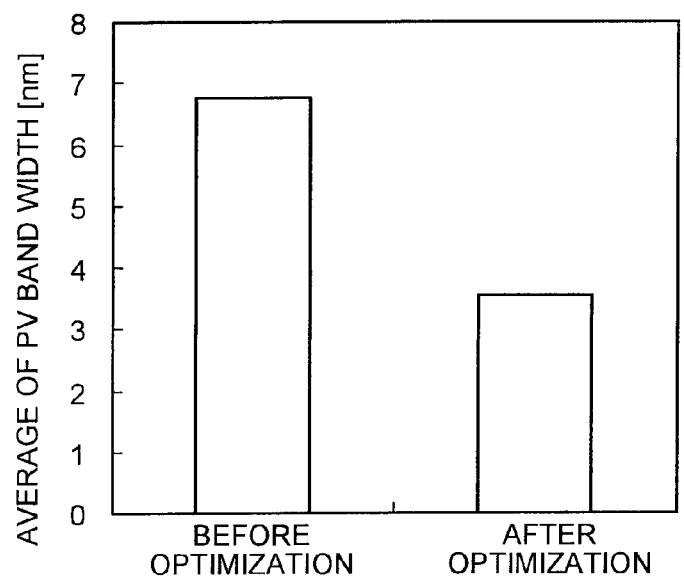
FIG. 17 is a graph of standard deviation of the PV band width.

An example of a simulation result obtained when a mask layout is created using the processing for optimizing a mask layout according to this embodiment is explained with reference to FIGS. 15 to 17. FIGS. 15 to 17 are graphs of a simulation result obtained by optimizing a coherence map model with respect to a host spot pattern. Exposure amounts before and after optimization and standard deviation of fluctuation amounts of pattern dimensions with respect to fluctuation in focus are shown in the figures.

A state of a change in PV band width in each iteration of optimization and mask layouts before and after the optimization are shown in FIG. 15. In the figure, the abscissa indicates the number of times of SRAF arrangement and the ordinate indicates a cost function (average of the PV band width). As shown in the figure, it can be confirmed that, when the SRAF arrangement is performed about twenty times, the PV band width approaches a target "0" (reduced from about 14 to about 2). It was confirmed that a mask layout can be optimized in short TAT.

The numbers of patterns with respect to the PV band width before and after the optimization are shown in FIG. 16. Averages of the PV band width before and after the optimization are shown in FIG. 17. As shown in FIG. 17, it can be configured that the average of the PV band width can be improved from 6.8 nanometers to 3.5 nanometers according to the processing for optimizing a mask layout according to this embodiment. Effectiveness of this embodiment was confirmed.

As explained above, according to the first embodiment, when SRAFs are formed using the coherence map method, a layout highly likely to be a dangerous point in the lithography process (a hot spot pattern) is set, a coherence map kernel (a physical model) for generating a mask layout is set with respect to the set design layout, a coherence map is created based on the set coherence map kernel and the set design layout, SRAFs are extracted from the coherence map and shaped to generate a mask layout, the cost function COST for evaluating an optimization degree of the mask layout is defined, the extracted mask layout is evaluated using the cost function, and at least one of parameters of the coherence map kernel and parameters in extracting SRAFs from the coherence map and shaping the SRAFs are changed until the mask layout evaluated using the cost function is optimized. Therefore, when auxiliary patterns are created using the coherence map method, it is possible to improve arrangement accuracy of the auxiliary patterns. Consequently, in the model-base SRAF arrangement of the coherence map method, it is possible to realize both TAT and accuracy.

The cost function COST is defined based on CD fluctuation amounts with respect to one or more process variation conditions. Therefore, it is possible to improve TAT and accuracy in adjusting the parameters.

Among the parameters of the coherence map kernel Φ, at least one of a parameter for adjusting XY anisotropy, a parameter for adjusting unbalance of EL/DoF, and a parameter for finely adjusting a coherence map kernel to improve approximation accuracy of the coherence map kernel is changed. Therefore, it is possible to create a mask layout having robustness with margin specifications flexibly taken into account and create a mask layout fitting in specifications requiring both EL and DoF.

One coherence map kernel is selected, based on feature values of a design layout, out of a plurality of coherence map kernels. Therefore, it is possible to calculate an optimum coherence map kernel Φ depending on layout variation and further improve accuracy of the coherence map kernel Φ.

In the following explanation in a second embodiment, the parameters optimized in the optimization processing according to the first embodiment are applied to an entire layout (a lager layout). In the explanation in the first embodiment, the parameters are optimized such that a mask layout is optimized with respect to a hot spot pattern. However, it is also possible to optimize the parameters such that a mask layout is optimized with respect to a hot spot pattern of the entire layout and create a mask layout of the entire layout using the optimized parameters.

Figure 18:
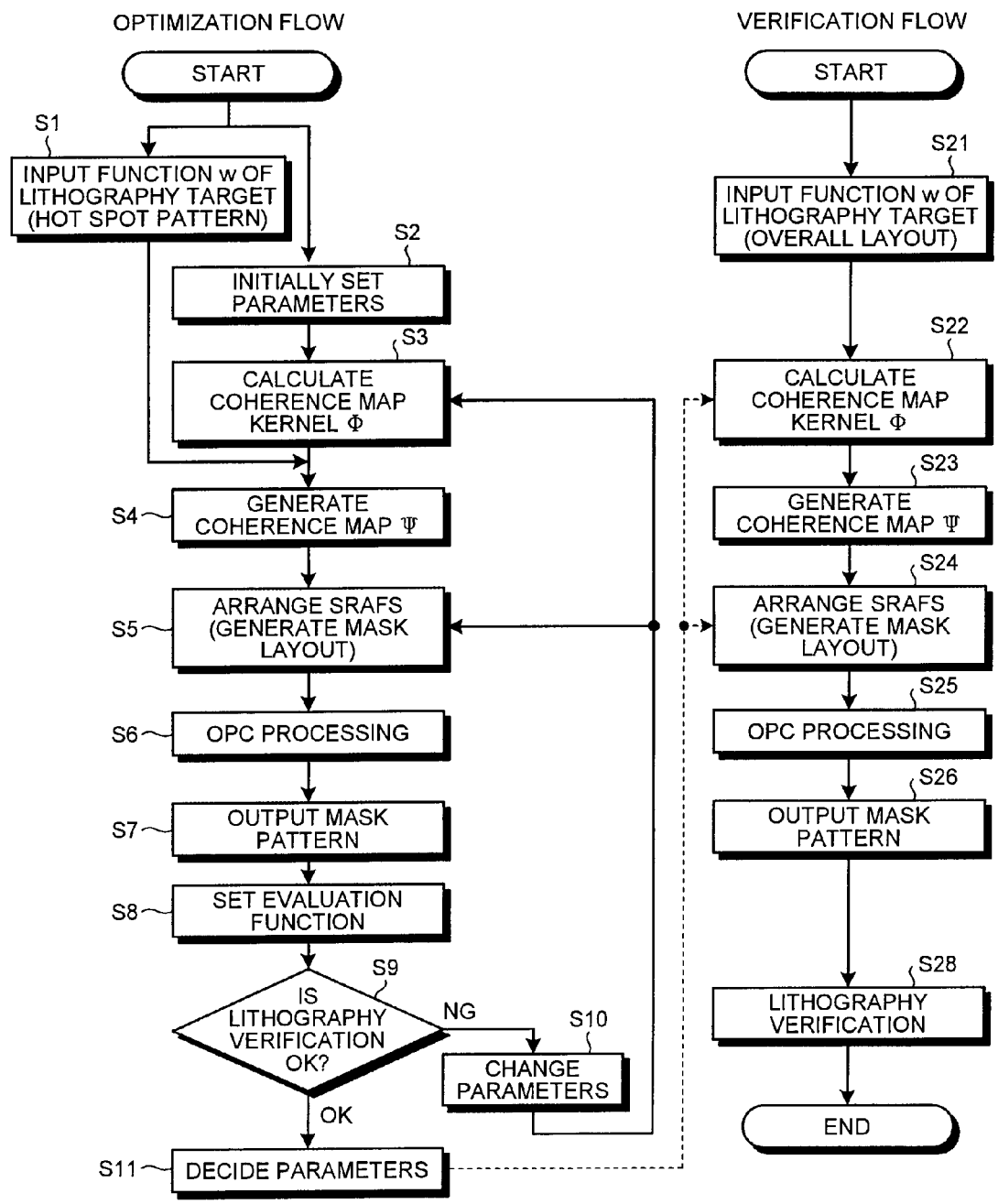
FIG. 18 is a flowchart for explaining a flow of applying parameters optimized in optimization processing in the first embodiment to a large layout.

FIG. 18 is a flowchart for explaining a flow of applying parameters of a coherence map kernel and extraction and shaping of SRAFs optimized with respect to hot spots to the entire layout and calculating model-base SRAFs. In FIG. 18, steps for performing processing same as that shown in FIG. 3 are denoted by the same step numbers and explanation of the steps is omitted.

In FIG. 18, when no hot spot or mask constraint violation is detected in the lithography verification ("OK" at step S9), parameters of the coherence map kernel Φ and parameters for extracting SRAFs from the coherence map Ψ and shaping the SRAFs are decided (step S11). The coherence map kernel Φ is calculated using the decided parameters (step S22). Concerning the entire layout (step S21), the coherence map Ψ is generated (step S23). SRAFs are extracted and shaped using the decided parameters (step S24), the OPC processing is performed (step S25), a mask pattern is output (step S26), and the lithography verification is performed (step S28).

When appropriate hot spots are selected as hot spots used in training the coherence map kernel Φ, it is possible to improve an effect of margin improvement with respect to process variations of the model-base SRAFs with respect to the entire layout (the large layout). According to this method, it is possible to realize, without a substantial increase in TAT, improvement of accuracy of optimization of the entire layout by the coherence map method.

Figure 19:
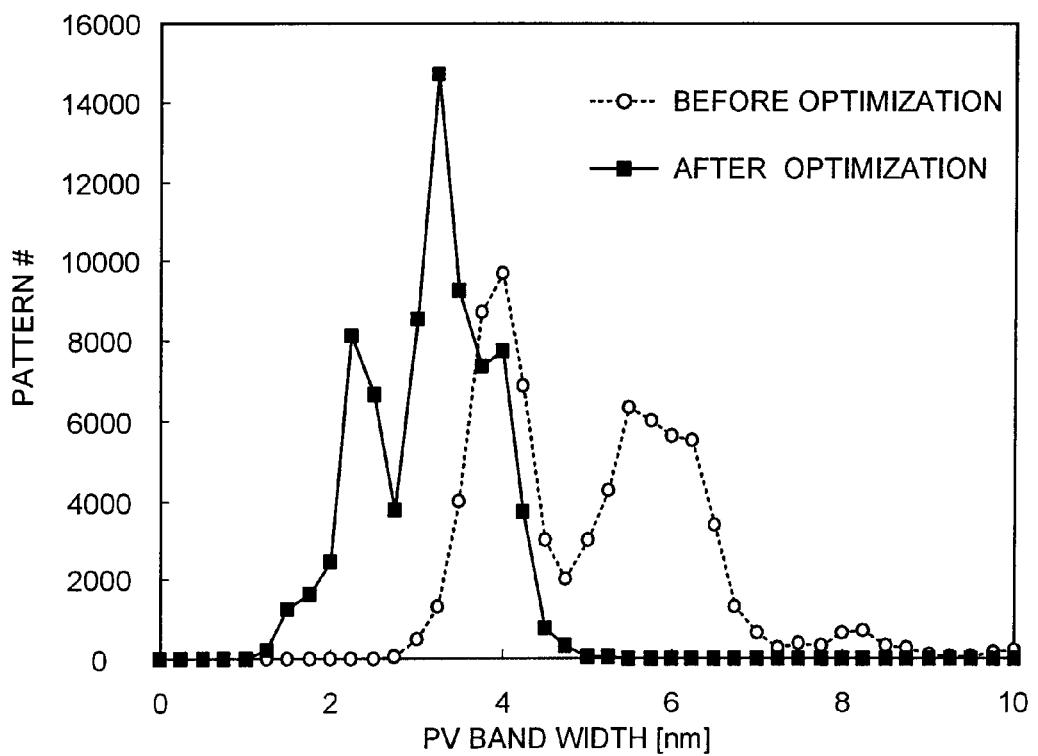
FIG. 19 is a graph of the number of patterns with respect to the PV band width.
Figure 20:
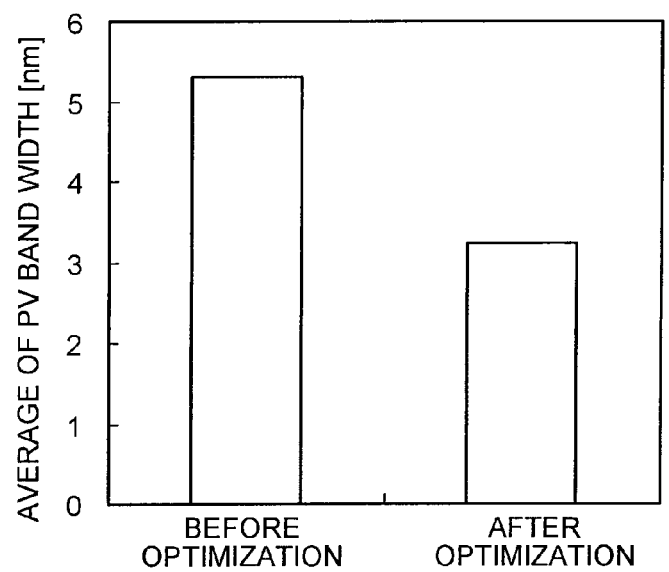
FIG. 20 is a graph of standard deviation of the PV band width.

It was examined how standard deviation of fluctuation amounts of pattern dimensions with respect to fluctuation in an exposure amount and focus changes with respect to another layout for verification using the coherence map kernel Φ before and after being optimized with respect to a hot spot pattern. The numbers of patterns with respect to PV band width before and after being optimized with respect to the hot spot pattern are shown in FIG. 19. Averages of the PV band width before and after the optimization are shown in FIG. 20. As shown in FIG. 20, in the layout for verification, as in the entire layout, it could be confirmed that the averages of the PV band width can be improved from 5.3 nanometers to 3.1 nanometers before and after the optimization.

Figure 21:
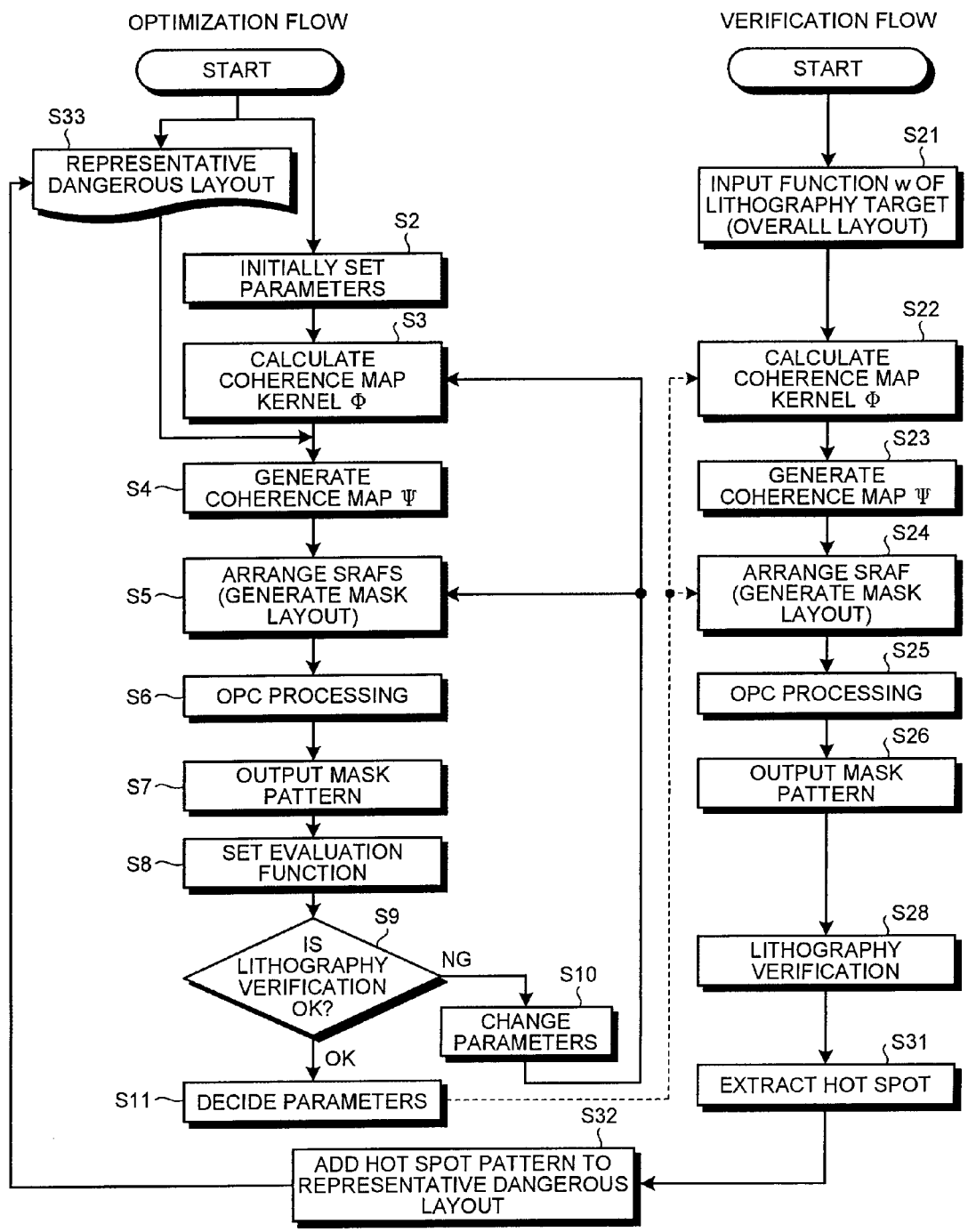
FIG. 21 is a flowchart for explaining an example of a flow for selecting a representative dangerous layout.

A method of selecting a representative dangerous layout (a hot spot pattern) used for parameter optimization is explained below. A representative dangerous layout used for parameter optimization is selected from a representative dangerous layout database and an optimum representative dangerous layout database is used as the representative dangerous layout database. This makes it possible to create a more optimum mask layout. FIG. 21 is a flowchart for explaining a flow of optimizing the representative dangerous layout database. In FIG. 21, steps for performing processing same as that in FIG. 18 are denoted by the same step numbers and explanation of the steps is omitted.

In FIG. 21, concerning various layouts (step S21), the coherence map Ψ is generated (steps S22 and S23), SRAF arrangement (step S24), OPC processing (step S25), mask pattern output (step S26), and lithography verification (step S28) are performed and a hot spot is extracted (step S31). The extracted hot spot pattern is added to the representative dangerous layout database (step S32). When optimization processing for parameters is performed, a representative dangerous layout is selected from the representative dangerous layout database (step S33).

In this way, a representative dangerous layout used for parameter optimization is selected from the representative dangerous layout database and an optimum representative dangerous layout is used as the representative dangerous layout. This makes it possible to create a more optimum mask layout.

According to the second embodiment, concerning a hot spot pattern of the entire layout, parameters are optimized and a mask layout of the entire layout is created using the optimized parameters such that the mask layout is optimized. Therefore, it is possible to improve accuracy of SRAF arrangement in the entire layout.

In the first and second embodiments, the mask-layout creating method and the like are explained. However, the present invention is not limited to the mask-layout creating method and the like. The present invention can be applied to a method of manufacturing a mask for lithography using the mask-layout creating method according to the embodiments and a method of manufacturing a semiconductor device using the mask-layout creating method according to the embodiments.

The mask-layout creating apparatus according to the first and second embodiments can be applied to a system including a plurality of apparatuses (e.g., a host computer, an interface apparatus, a display, a scanner, and a printer) or can be applied to an apparatus (a host computer, etc.) including one apparatus.

The first and second embodiments can also be attained by supplying a recording medium having recorded thereon a program code of software for realizing the functions of the mask-layout creating apparatus to a system or an apparatus and a computer (or a central processing unit (CPU), a micro processor unit (MPU), or a digital signal processor (DSP)) of the system or the apparatus executing the program code recorded on the recording medium. In this case, the program code itself read out from the recording medium realizes the functions of the mask-layout creating apparatus. The program code or the recording medium having recorded thereon a computer program code of the program code configures the present invention. As the recording medium for supplying the program code, an optical recording medium, a magnetic recording medium, a magneto-optical recording medium, or a semiconductor recording medium such as an flexible disk (FD), a hard disk, an optical disk, a magneto-optical disk, a compact disk-read only memory (CD-ROM), a compact disk-recordable (CD-R), a magnetic tape, a nonvolatile memory, or a read only memory (ROM) can be used.

The functions of the mask-layout creating apparatus are not only realized by the computer executing the read-out program code. It goes without saying that an operating system (OS) or the like running on the computer performs, based on an instruction of the program code, a part of actual processing or the entire actual processing and the functions of the mask-layout creating apparatus are realized by the processing.

It goes without saying that, after the program code read out from the recording medium is written in a memory included in a function extension board inserted in the computer or a function extension unit connected to the computer, a CPU or the like included in the function extension board or the function extension unit performs, based on an instruction of the program code, a part of actual processing or the entire actual processing and the functions of the mask-layout creating apparatus are realized by the processing.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask-layout creating method for generating a mask layout in which an auxiliary pattern is formed with respect to a design layout, the mask-layout creating method comprising:

setting a design layout highly likely to be a dangerous point in a lithography process;

setting, with respect to the set design layout, a coherence map kernel for generating the mask layout;

creating, based on the set coherence map kernel and the set design layout, a coherence map;

extracting the auxiliary pattern from the created coherence map, shaping the auxiliary pattern, and generating the mask layout;

defining a cost function for evaluating an optimization degree of the mask layout and evaluating the optimization degree of the generated mask layout using the cost function; and changing, by a computer, parameters in setting the coherence map kernel to improve the evaluated optimization degree.

2. The mask-layout creating method according to claim 1, wherein the defining the cost function includes defining the cost function based on a CD fluctuation amount with respect to one or more process variation conditions.

3. The mask-layout creating method according to claim 1, wherein the changing the parameters includes changing at least one of a parameter for adjusting XY anisotropy, a parameter for adjusting unbalance of EL/DoF, or a parameter for finely adjusting the coherence map kernel to improve an approximation accuracy of the coherence map kernel.

4. The mask-layout creating method according to claim 1, wherein the setting the coherence map kernel includes selecting, based on a feature value of the design layout, one coherence map kernel from a plurality of coherence map kernels.

5. The mask-layout creating method according to claim 4, wherein the feature value of the design layout is at least one of pitch of patterns, size, shape, an area, and a wring direction of the design layout.

6. The mask-layout creating method according to claim 1, wherein:
the setting a design layout includes setting a design layout highly likely to be a dangerous point in the lithography process in an entire layout, and
the mask-layout creating method further comprises creating a complete mask layout of the entire layout using the parameters that optimize the mask layout with respect to the design layout highly likely to be a dangerous point in the lithography process.

7. A mask-layout creating apparatus that generates a mask layout in which an auxiliary pattern is formed with respect to a design layout, the mask-layout creating apparatus comprising:
a design-layout setting unit that sets a design layout highly likely to be a dangerous point in a lithography process;
a coherence-map-kernel setting unit that sets, with respect to the design layout set by the design-layout setting unit, a coherence map kernel for generating the mask layout;
a coherence-map creating unit that creates, based on the coherence map kernel set by the coherence-map-kernel setting unit and the design layout set by the design-layout setting unit, a coherence map;
a mask-layout generating unit that extracts the auxiliary pattern from the coherence map created by the coherence-map creating unit, shapes the auxiliary pattern, and generates the mask layout;
an evaluating unit that defines a cost function for evaluating an optimization degree of the mask layout and evaluates the optimization degree using the cost function; and
a changing unit that changes parameters in setting the coherence map kernel in the coherence-map-kernel setting unit to improve the optimization degree.

8. A non-transitory computer-readable storage medium having computer instructions recorded thereon which, when executed by a processor, perform a mask-layout creating method that generates a mask layout in which an auxiliary pattern is formed with respect to a design layout, the method comprising:
setting a design layout highly likely to be a dangerous point in a lithography process;
setting, with respect to the set design layout, a coherence map kernel for generating the mask layout;
creating, based on the set coherence map kernel and the set design layout, a coherence map;
extracting the auxiliary pattern from the created coherence map, shaping the auxiliary pattern, and generating the mask layout;
defining a cost function for evaluating an optimization degree of the mask layout and evaluating the optimization degree using the cost function; and
changing, parameters in setting the coherence map kernel to improve the evaluated optimization degree.

* * * * *